(12) United States Patent
Yagishita

(10) Patent No.: US 10,355,692 B2
(45) Date of Patent: Jul. 16, 2019

(54) POWER SOURCE MONITORING CIRCUIT, POWER ON RESET CIRCUIT, AND SEMICONDUCTOR DEVICE

(71) Applicant: SONY CORPORATION, Tokyo (JP)

(72) Inventor: Yuki Yagishita, Kanagawa (JP)

(73) Assignee: Sony Corporation, Tokyo (JP)

(*) Notice: Subject to any disclaimer, the term of this patent is extended or adjusted under 35 U.S.C. 154(b) by 7 days.

(21) Appl. No.: 15/531,825

(22) PCT Filed: Dec. 2, 2015

(86) PCT No.: PCT/JP2015/083897
§ 371 (c)(1),
(2) Date: May 31, 2017

(87) PCT Pub. No.: WO2016/098593
PCT Pub. Date: Jun. 23, 2016

(65) Prior Publication Data
US 2018/0123590 A1    May 3, 2018

(30) Foreign Application Priority Data

Dec. 16, 2014 (JP) .................. 2014-254156
Dec. 16, 2014 (JP) .................. 2014-254157

(51) Int. Cl.
*H03K 19/0185* (2006.01)
*H03K 19/00* (2006.01)
(Continued)

(52) U.S. Cl.
CPC ......... *H03K 19/0185* (2013.01); *H03K 3/012* (2013.01); *H03K 3/35613* (2013.01);
(Continued)

(58) Field of Classification Search
None
See application file for complete search history.

(56) References Cited

U.S. PATENT DOCUMENTS 5,155,384 A * 10/1992 Ruetz ................. G05F 3/267
327/143
5,343,085 A    8/1994 Fujimoto et al.
(Continued)

FOREIGN PATENT DOCUMENTS

CN    1283853 A    2/2001
EP    1074993 A1   2/2001
(Continued)

OTHER PUBLICATIONS

International Search Report and Written Opinion of PCT Application No. PCT/JP2015/083897, dated Jan. 19, 2016, 04 pages of English Translation and 09 pages of ISRWO.

*Primary Examiner* — Crystal L Hammond
(74) *Attorney, Agent, or Firm* — Chip Law Group

(57) ABSTRACT

The present technology relates to a semiconductor device that includes a level shifter circuit that performs level conversion on a digital signal output from a predetermined block and outputs a resultant signal to another block that operates by a power source different from the power source of the predetermined block, and a power source monitoring circuit that controls an operation of the level shifter circuit. The power source monitoring circuit stops an operation of the level shifter circuit on the basis of a status of the power source that supplies power to the predetermined block and a standby control signal for controlling an operation status of the other block. Further, the power source monitoring circuit is provided with a transistor on a path of a steady-state current, and the steady-state current is inhibited from flowing in accordance with the standby control signal.

14 Claims, 20 Drawing Sheets

(51) Int. Cl.
  *H03K 3/012* (2006.01)
  *H03K 17/22* (2006.01)
  *H03K 19/0948* (2006.01)
  *H03K 3/356* (2006.01)

(52) U.S. Cl.
  CPC . *H03K 3/356165* (2013.01); *H03K 3/356182* (2013.01); *H03K 17/223* (2013.01); *H03K 19/0013* (2013.01); *H03K 19/0016* (2013.01); *H03K 19/018528* (2013.01); *H03K 19/0948* (2013.01)

(56) References Cited

U.S. PATENT DOCUMENTS

| | | | | |
|---|---|---|---|---|
| 5,469,080 | A * | 11/1995 | Son | H03K 19/0013 326/71 |
| 6,252,452 | B1 * | 6/2001 | Hatori | H03K 3/0315 327/544 |
| 6,426,908 | B1 * | 7/2002 | Hidaka | G11C 5/14 365/222 |
| 2002/0180508 | A1 * | 12/2002 | Kanno | H03K 19/0016 327/333 |
| 2005/0195012 | A1 * | 9/2005 | Sueoka | H03K 3/356182 327/333 |
| 2006/0279346 | A1 | 12/2006 | Seki et al. | |
| 2008/0048719 | A1 | 2/2008 | Ogawa | |
| 2008/0246519 | A1 * | 10/2008 | Suzuki | H03K 5/1515 327/141 |
| 2010/0327960 | A1 * | 12/2010 | Huber | H03K 19/0016 327/538 |
| 2017/0188996 | A1 * | 7/2017 | Kajiyama | A61B 8/00 |

FOREIGN PATENT DOCUMENTS

| | | |
|---|---|---|
| JP | 05-291915 A | 11/1993 |
| JP | 07-212217 A | 8/1995 |
| JP | 2000-138348 A | 5/2000 |
| JP | 2001-052476 A | 2/2001 |
| JP | 2004-260648 A | 9/2004 |
| JP | 2006-352195 A | 12/2006 |
| JP | 2008-079298 A | 4/2008 |
| JP | 2010-166405 A | 7/2010 |
| KR | 10-2001-0020894 A | 3/2001 |

* cited by examiner

POWER SOURCE MONITORING CIRCUIT, POWER ON RESET CIRCUIT, AND SEMICONDUCTOR DEVICE

CROSS REFERENCE TO RELATED APPLICATIONS

This application is a U.S. National Phase of International Patent Application No. PCT/JP2015/083897 filed on Dec. 2, 2015, which claims priority benefit of Japanese Patent Application No. JP 2014-254156 filed in the Japan Patent Office on Dec. 16, 2014 and also claims priority benefit of Japanese Patent Application No. JP 2014-254157 filed in the Japan Patent Office on Dec. 16, 2014. Each of the above-referenced applications is hereby incorporated herein by reference in its entirety.

TECHNICAL FIELD

The present technology relates to a power source monitoring circuit, a power on reset circuit, and a semiconductor device, and more particularly to, a power source monitoring circuit, a power on reset circuit, and a semiconductor device that are capable of reducing a steady-state current.

BACKGROUND ART

In the past, in a case where various digital signals such as a clock signal and a control signal are transmitted from a block that operates by a predetermined power source to a block that operates by another power source different from the above power source, a level shifter circuit that converts a signal level of the digital signal has been used.

For example, in a case where the digital signal is transmitted from a front-stage block to a rear-stage block via a level shifter circuit, when a power source of the front-stage block is not activated, a through current flows and current consumption is increased in a general level shifter circuit.

In this regard, the technologies of constantly monitoring the power source to thus prevent the through current from flowing are proposed (see, for example, Patent Literature 1 and Patent Literature 2).

In those technologies, a power source monitoring circuit monitors a power source status of a front-stage block, and in a state where a power source that supplies power to the front-stage block is not activated, the logic of the level shifter circuit is determined and the through current is prevented from flowing in the level shifter circuit.

CITATION LIST

Patent Literature

Patent Literature 1: Japanese Patent Application Laid-open No. 2010-166405
Patent Literature 2: Japanese Patent Application Laid-open No. 2006-352195

DISCLOSURE OF INVENTION

Technical Problem

In the technologies described above, however, in a state where the power source is activated, the steady-state current flows in the power source monitoring circuit, and the current consumption is increased.

In particular, in a case where a power source voltage of the rear-stage block is larger than a power source voltage of the front-stage block, for example, in a case where there is a potential difference between the power source voltages, such as 2.5 V of the power source voltage of the rear-stage block and 1.2 V of the power source voltage of the front-stage block, a large steady-state current flows in the power source monitoring circuit.

The present technology has been made in view of the circumstances as described above and is capable of reducing a steady-state current.

Solution to Problem

A power source monitoring circuit according to a first aspect of the present technology controls an operation of a level shifter on the basis of a status of a first power source that supplies power to a first block and an operation status control signal for controlling an operation status of a second block that receives power supply from a second power source and receives supply of a signal, the second power source being different from the first power source, the signal being output from the first block and level-converted by the level shifter. The power source monitoring circuit includes a current control unit that is provided on a path of a steady-state current and sets a state where the steady-state current is inhibited from flowing in accordance with the operation status control signal.

In the power source monitoring circuit, in a case where the operation status control signal is a signal indicating that the operation status of the second block is set to a standby state, the operation of the level shifter can be stopped.

The current control unit can be a transistor that is turned off in a case where the operation status control signal is a signal indicating that the operation status of the second block is set to a standby state.

In the power source monitoring circuit, in a case where the first power source is not activated, the second block can be set to a standby state.

In the first aspect of the present technology, an operation of a level shifter is controlled on the basis of a status of a first power source that supplies power to a first block and an operation status control signal for controlling an operation status of a second block that receives power supply from a second power source and receives supply of a signal, the second power source being different from the first power source, the signal being output from the first block and level-converted by the level shifter, and a steady-state current is inhibited from flowing in accordance with the operation status control signal.

A semiconductor device according to a second aspect of the present technology includes: a first block that operates by power supply from a predetermined power source; a level shifter that performs level conversion on a signal that is output from the first block; a second block that operates by power supply from another power source different from the power source and receives supply of a signal that is obtained by the level conversion; and a power source monitoring circuit that controls an operation of the level shifter on the basis of a status of the power source and an operation status control signal for controlling an operation status of the second block, the power source monitoring circuit including a current control unit that is provided on a path of a steady-state current and sets a state where the steady-state current is inhibited from flowing in accordance with the operation status control signal.

In a case where the operation status control signal is a signal indicating that the operation status of the second block is set to a standby state, the power source monitoring circuit can stop the operation of the level shifter.

The current control unit can be a transistor that is turned off in a case where the operation status control signal is a signal indicating that the operation status of the second block is set to a standby state.

In a case where the power source is not activated, the power source monitoring circuit can set the second block to a standby state.

The semiconductor device can include the multiple level shifters, and the power source monitoring circuit can supply the same control signal to each of the multiple level shifters and control an operation of each of the multiple level shifters.

The semiconductor device can include the multiple second blocks, and the one or more level shifters and the power source monitoring circuit for each of the second blocks.

The multiple second blocks can operate by power supply from other power sources having mutually different power source voltages.

The multiple second blocks can operate by power supply from the other same power source.

The semiconductor device can further include a first power gate switch that is provided between the power source and the first block.

The semiconductor device can further include a second power gate switch that is provided between the other power source and the second block and is turned on or off in accordance with control of the power source monitoring circuit.

In the second aspect of the present technology, a first block operates by power supply from a predetermined power source, level conversion is performed by a level shifter on a signal that is output from the first block, a second block operates by power supply from another power source different from the power source and receives supply of a signal that is obtained by the level conversion. An operation of the level shifter is controlled by a power source monitoring circuit on the basis of a status of the power source and an operation status control signal for controlling an operation status of the second block. Further, the power source monitoring circuit includes a current control unit that is provided on a path of a steady-state current and sets a state where the steady-state current is inhibited from flowing in accordance with the operation status control signal.

A power on reset circuit according to a third aspect of the present technology includes: a counter that performs a count operation on the basis of an input clock signal; a reset signal output unit that outputs a reset signal for resetting an outside block, on the basis of a count result by the counter; and a first power gate switch that controls power supply to the counter in accordance with the reset signal.

The power on reset circuit can further include: an oscillation unit that outputs the clock signal; and a second power gate switch that controls power supply to the oscillation unit in accordance with the reset signal.

In a case where reset of the outside block by the reset signal is cancelled, the second power gate switch can stop the power supply to the oscillation unit.

The second power gate switch can control the power supply to the oscillation unit in accordance with an outside control signal for controlling an oscillation operation of the oscillation unit and the reset signal.

In a case where the outside control signal is a signal indicating stop of the oscillation operation and in a case where reset of the outside block by the reset signal is cancelled, the second power gate switch can stop the power supply to the oscillation unit.

The power on reset circuit can further include an initialization unit that resets the counter and the reset signal output unit and, in a case where a power source is activated, cancels reset of the counter and the reset signal output unit.

In the third aspect of the present technology, a count operation is performed by a counter on the basis of an input clock signal, a reset signal for resetting an outside block is output by a reset signal output unit on the basis of a count result by the counter, and power supply to the counter is controlled by a first power gate switch in accordance with the reset signal.

A semiconductor device according to a fourth aspect of the present technology includes a power on reset circuit, the power on reset circuit including a counter that performs a count operation on the basis of an input clock signal, a reset signal output unit that outputs a reset signal for resetting an outside block, on the basis of a count result by the counter, and a power gate switch that controls power supply to the counter in accordance with the reset signal.

In the fourth aspect of the present technology, a count operation is performed by a counter on the basis of an input clock signal, a reset signal for resetting an outside block is output by a reset signal output unit on the basis of a count result by the counter, and power supply to the counter is controlled by a power gate switch in accordance with the reset signal.

Advantageous Effects of Invention

According to the first aspect and the second aspect of the present technology, it is possible to reduce a steady-state current. Further, according to the third aspect and the fourth aspect of the present technology, it is possible to reduce a leakage current.

It should be noted that the effects described herein are not necessarily limited and may be any one of the effects described in this disclosure.

MODE(S) FOR CARRYING OUT THE INVENTION

Hereinafter, embodiments to which the present technology is applied will be described with reference to the drawings.

First Embodiment

Configuration Example of Semiconductor Device

The present technology is to reduce a steady-state current, in a power source monitoring circuit for reducing a through current in a level shifter circuit that converts the level of a signal output from a front-stage block and outputs the signal to a rear-stage block, by stopping the operation of the power source monitoring circuit itself in accordance with a status of a power source of the front-stage block and an operation status of the rear-stage block.

The present technology as described above can be applied to various electronic apparatuses including a sensor network, a mobile wearable device, a network device, a portable device such as a mobile phone, an imaging apparatus, and the like, and to semiconductor devices that constitute those electronic apparatuses.

Figure 1:
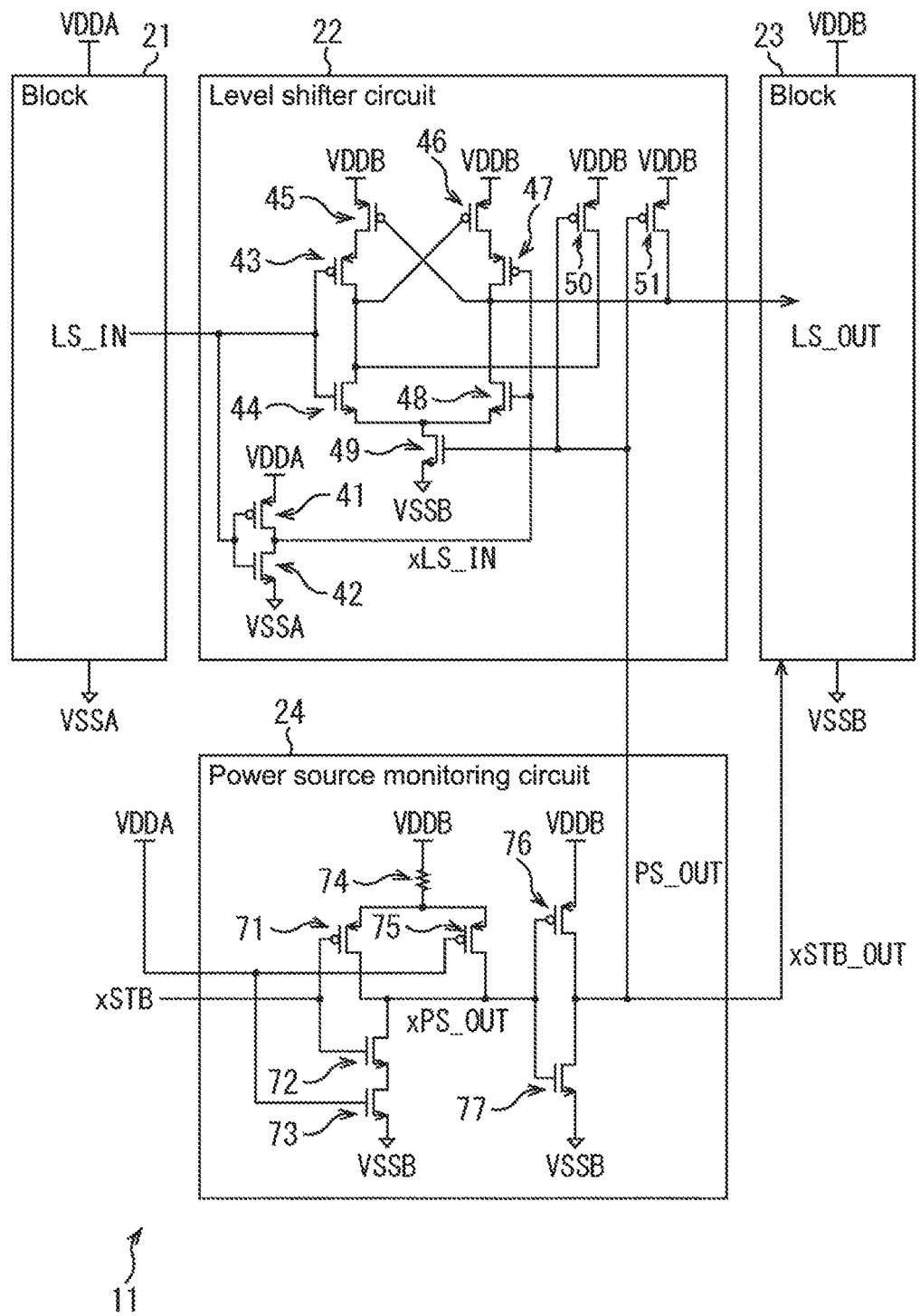
FIG. 1 is a diagram showing a configuration example of a semiconductor device to which the present technology is applied.

FIG. 1 is a diagram showing a configuration example of one embodiment of a semiconductor device to which the present technology is applied.

A semiconductor device 11 shown in FIG. 1 includes a block 21, a level shifter circuit 22, a block 23, and a power source monitoring circuit 24.

The block 21 is a semiconductor circuit that operates by power supply from a power source VDDA and outputs a predetermined digital signal LS_IN to the level shifter circuit 22. Here, the digital signal LS_IN may be any signals such as a clock signal, a control signal, and a data signal. Further, hereinafter, a power source voltage of the power source VDDA will also be referred to as a voltage VDDA as appropriate.

The level shifter circuit 22 operates by power supply from a power source VDDB that is different from the power source VDDA in power source voltage. Specifically, the level shifter circuit 22 performs level conversion on the digital signal LS_IN, which is supplied from the block 21 at the front stage, and outputs a resultant digital signal LS_OUT to the block 23 at the rear stage.

Further, the level shifter circuit 22 stops the operation in accordance with a control signal PS_OUT supplied from the power source monitoring circuit 24. In this example, in a case where the control signal PS_OUT is at H level (High level), the level shifter circuit 22 normally operates, and in a case where the control signal PS_OUT is at L level (Low level), the level shifter circuit 22 stops the operation.

The block 23 is a semiconductor circuit that operates by power supply from the power source VDDB and operates in accordance with the digital signal LS_OUT supplied from the level shifter circuit 22. It should be noted that hereinafter a power source voltage of the power source VDDB will also be referred to as a voltage VDDB.

Further, the block 23 enters a standby state in accordance with a standby control signal xSTB_OUT supplied from the power source monitoring circuit 24 and temporarily stops the operation. For example, the power supply to the block 23 is temporarily stopped, and the block 23 thus stops the operation.

In this example, in a case where the standby control signal xSTB_OUT is at H level, the block 23 normally operates, and in a case where the standby control signal xSTB_OUT is at L level, the block 23 enters a standby state.

The power source monitoring circuit 24 operates by power supply from a power source VDDB, generates the control signal PS_OUT and the standby control signal xSTB_OUT in accordance with a status of the power source VDDA and a standby control signal xSTB that specifies (controls) an operation status of the block 23, and outputs those signals.

Here, the standby control signal xSTB is a signal supplied from the outside of the power source monitoring circuit 24 and is a signal indicating whether the operation status of the block 23 is set to a standby state or a normal operation state. Specifically, in a case where the standby control signal xSTB is at L level, this indicates that the block 23 is set to a standby state, and in a case where the standby control signal xSTB is at H level, this indicates that the block 23 is set to a normal operation state.

Further, the power source monitoring circuit 24 stops the operation thereof in accordance with the standby control signal xSTB supplied from the outside and inhibits a steady-state current from flowing in the power source monitoring circuit 24.

Furthermore, the level shifter circuit 22 is constituted of a transistor 41 to a transistor 51. Here, the transistor 41, the transistor 43, the transistor 45 to the transistor 47, the transistor 50, and the transistor 51 are PMOS (P type Metal Oxide Semiconductor) transistors, and the transistor 42, the transistor 44, the transistor 48, and the transistor 49 are NMOS (N type Metal Oxide Semiconductor) transistors.

In the level shifter circuit 22, an inverter circuit is constituted of the transistor 41 and the transistor 42, and the digital signal LS_IN output from the block 21 is supplied to gates of those transistor 41 and transistor 42. Further, a source of the transistor 41 is connected to the power source VDDA, a source of the transistor 42 is connected to the ground of a potential VSSA, and drains of the transistor 41 and the transistor 42 are connected to each other. A potential of the drains of the transistor 41 and the transistor 42 is then supplied, as an output signal xLS_IN, to gates of the respective transistor 47 and transistor 48.

Further, the digital signal LS_IN output from the block 21 is supplied to a gate of the transistor 43, a source of the transistor 43 is connected to a drain of the transistor 45, and a drain of the transistor 43 is connected to a drain of the transistor 44.

The digital signal LS_IN output from the block 21 is supplied to a gate of the transistor 44, and a source of the transistor 44 is connected to a drain of the transistor 49 and a source of the transistor 48.

A source of the transistor 45 is connected to a power source VDDB, a gate of the transistor 45 is connected to drains of the transistor 47 and the transistor 48. Further, a source of the transistor 46 is connected to a power source VDDB, and a gate of the transistor 46 is connected to the drains of the transistor 43 and the transistor 44.

A source of the transistor 47 is connected to a drain of the transistor 46, and the drain of the transistor 48 is connected to a drain of the transistor 47. A potential of the drains of the transistor 47 and the transistor 48 is output, as a digital signal LS_OUT, to the block 23.

Further, in the level shifter circuit 22, the control signal PS_OUT output from the power source monitoring circuit 24 is supplied to each gate of the transistor 49, the transistor 50, and the transistor 51.

A source of the transistor 49 is connected to the ground of a potential VSSB. Further, a source of the transistor 50 is connected to a power source VDDB, and a drain of the transistor 50 is connected to the drains of the transistor 43 and the transistor 44. Furthermore, a source of the transistor 51 is connected to a power source VDDB, and a drain of the transistor 51 is connected to the drains of the transistor 47 and the transistor 48.

The power source monitoring circuit 24 is constituted of a transistor 71 to a transistor 73, a resistor 74, and a transistor 75 to a transistor 77.

Here, the transistor 71, the transistor 75, and the transistor 76 are PMOS transistors, and the transistor 72, the transistor 73, and the transistor 77 are NMOS transistors.

The standby control signal xSTB is supplied to gates of the transistor 71 and the transistor 72 from the outside. Further, a source of the transistor 71 is connected to a power source VDDB via the resistor 74, and a drain of the transistor 71 is connected to drains of the transistor 72 and the transistor 75 and to gates of the transistor 76 and the transistor 77.

A source of the transistor 72 is connected to the ground of a potential VSSB via the transistor 73. Further, the drain of the transistor 72 is connected to the power source VDDB via the transistor 71 and the resistor 74. In other words, the transistor 72 is disposed between the power source VDDB and the ground of the potential VSSB.

The power source VDDA is connected to a gate of the transistor 73, a source of the transistor 73 is connected to the ground of the potential VSSB, and a drain of the transistor 73 is connected to the source of the transistor 72.

A gate of the transistor 75 is connected to the power source VDDA, and a source of the transistor 75 is connected to the power source VDDB via the resistor 74.

Further, the drain of the transistor 75 is connected to the gates of the transistor 76 and the transistor 77. In this example, a potential of the drain of the transistor 75 is an output signal xPS_OUT. In other words, the output signal xPS_OUT is output from the transistor 71, the transistor 75, or the transistor 73.

A source of the transistor 76 is connected to a power source VDDB, and a drain of the transistor 76 is connected to a drain of the transistor 77. Further, a source of the transistor 77 is connected to the ground of a potential VSSB.

An inverter circuit is constituted of those transistor 76 and transistor 77, and an output thereof, that is, a potential of the drains of the transistor 76 and the transistor 77 is output as the control signal PS_OUT and the standby control signal xSTB_OUT. Here, the control signal PS_OUT is supplied to the gates of the transistor 49, the transistor 50, and the transistor 51 of the level shifter circuit 22, and the standby control signal xSTB_OUT is supplied to the block 23.

In such a manner, in the power source monitoring circuit 24, the logic of the control signal PS_OUT is determined in accordance with a combination of an on/off state of the transistor 73 and the transistor 75 that monitor a status of the power source VDDA, that is, whether the power source VDDA is activated, and an on/off state of the transistor 71 and the transistor 72 that monitor the standby control signal xSTB for controlling the operation status of the block 23.

<Description on Operation of Semiconductor Device>

(Case where the Power Source VDDA is Activated and the Standby Control Signal xSTB is at H Level)

Next, an operation of the semiconductor device 11 will be described.

First, description will be given on a case where the power source VDDA is activated and the standby control signal xSTB being at H level is supplied from the outside so as to cause the block 23 to normally operate.

In this case, the control signal PS_OUT supplied from the power source monitoring circuit 24 to the level shifter circuit 22 becomes H level, and the level shifter circuit 22 normally operates. In other words, the level shifter circuit 22 performs level conversion on the digital signal LS_IN supplied from the block 21, and outputs a resultant digital signal LS_OUT to the block 23 at the rear stage.

Specifically, when the power source VDDA is activated, in the power source monitoring circuit 24, the transistor 73 is turned on, that is, set to an electrically continuous state. Further, since the standby control signal xSTB is at H level, the transistor 72 is also turned on.

Thus, the output signal xPS_OUT output from the transistor 73 becomes L level (potential VSSB). As a result, the transistor 76 is turned on, and a signal being at H level (voltage VDDB) is supplied, as the control signal PS_OUT, from the transistor 76 to the gates of the transistor 49, the transistor 50, and the transistor 51 of the level shifter circuit 22.

Further, at that time, the signal being at H level (voltage VDDB) output from the transistor 76 is supplied, not only as the control signal PS_OUT but also as the standby control signal xSTB_OUT, to the block 23. In this case, since the standby control signal xSTB_OUT supplied to the block 23 is at H level, the block 23 normally operates.

Furthermore, the level shifter circuit 22, to which the control signal PS_OUT being at H level is supplied from the power source monitoring circuit 24, normally operates and performs level conversion on the digital signal LS_IN.

For example, in a case where the digital signal LS_IN is at H level (voltage VDDA), the transistor 42 is turned on, and the output signal xLS_IN thus becomes L level. Thus, the transistor 47 is turned on.

Further, since the digital signal LS_IN is at H level, the transistor 44 is turned on, and since the control signal PS_OUT is at H level, the transistor 49 is turned on. Thus, the gate of the transistor 46 is connected to the ground of the potential VSSB via the transistor 44 and the transistor 49. That is to say, a voltage level applied to the gate of the transistor 46 is L level.

As a result, the transistor 46 is turned on, and the digital signal LS_OUT being at H level (voltage VDDB) is output from the transistor 46 to the block 23 via the transistor 47. Thus, the input digital signal LS_IN of the voltage VDDA is converted into the digital signal LS_OUT of the voltage VDDB.

Meanwhile, in a case where the digital signal LS_IN is at L level, the transistor 41 is turned on, and the output signal xLS_IN thus becomes H level. Thus, the transistor 48 is turned on.

Further, since the control signal PS_OUT is at H level, the transistor 49 is turned on, and the transistor 48 is connected to the ground of the potential VSSB via the transistor 49. As a result, the digital signal LS_OUT being at L level (potential VSSB) is output from the transistor 48 to the block 23. Thus, the digital signal LS_IN being at the level of the potential VSSA of the ground with respect to the power source VDDA is converted into the digital signal LS_OUT being at the level of the potential VSSB of the ground with respect to the power source VDDB.

(Case in a State where the Power Source VDDA is not Activated)

Subsequently, description will be given on a case in a state where the power source VDDA is not activated.

In this case, irrespective of the standby control signal xSTB, the statuses of the digital signal LS_IN and the output signal xLS_IN are unstable, and the logic of the digital signal LS_OUT is fixed to H level.

In other words, in a state where the power source VDDA is not activated, in the power source monitoring circuit 24, the transistor 75 is turned on, and the output signal xPS_OUT being at H level is output from the transistor 75. The transistor 77, to which the output signal xPS_OUT is supplied, is then turned on. Thus, the signal being at L level (potential VSSB) output from the transistor 77 is supplied, as the control signal PS_OUT, to the level shifter circuit 22 and also supplied, as the standby control signal xSTB_OUT, to the block 23.

In this case, since the standby control signal xSTB_OUT supplied to the block 23 is at L level, the block 23 enters a standby state irrespective of the standby control signal xSTB.

Furthermore, the level shifter circuit 22, to which the control signal PS_OUT being at L level is supplied from the power source monitoring circuit 24, stops the operation. In other words, the control signal PS_OUT being at L level is supplied to the gate of the transistor 51, and the transistor 51 is thus turned on. As a result, the digital signal LS_OUT output to the block 23 is fixed to H level (voltage VDDB).

In such a manner, in a case where the control signal PS_OUT is at L level, the level shifter circuit 22 does not operate, and the logic of the output thereof, the digital signal LS_OUT, is fixed to H level.

It should be noted that when the block 23 is in the standby state, the digital signal LS_OUT is not used in the block 23. Thus, if the digital signal LS_OUT is fixed to H level, no inconvenience is particularly caused.

Further, the control signal PS_OUT output from the power source monitoring circuit 24 is also supplied to the transistor 49. However, since the control signal PS_OUT is at L level, the transistor 49 enters a turned-off state (non-electrically continuous state). Therefore, in the turned-off state of the transistor 49, the level shifter circuit 22 is disconnected from the ground of the potential VSSB, and thus a through current is inhibited from flowing in the level shifter circuit 22 itself.

In such a manner, disposing the transistor 49 on a path of the through current of the level shifter circuit 22, the transistor 49 being turned on or off in accordance with the control signal PS_OUT, can prevent the through current from flowing in the level shifter circuit 22 when the power source VDDA is not activated. Thus, current consumption of the semiconductor device 11 can be cut down.

(Case where the Power Source VDDA is Activated and the Standby Control Signal xSTB is at L Level)

Furthermore, description will be given on a case where the power source VDDA is activated and the standby control signal xSTB being at L level is supplied so as to cause the block 23 to enter a standby state.

In this case, the power source monitoring circuit 24 enters a state where the operation is stopped, and the control signal PS_OUT supplied from the power source monitoring circuit 24 to the level shifter circuit 22 becomes L level. Further, the standby control signal xSTB_OUT also becomes L level, and the block 23 thus enters a standby state.

In a case where the standby control signal xSTB supplied from the outside is at L level, the transistor 72 is turned off. This leads to a state where the steady-state current, which results from the power source VDDB, is inhibited from flowing in the transistor 73 within the power source monitoring circuit 24.

In particular, in a case where a difference between the voltage VDDA and the voltage VDDB is large, a large amount of steady-state current flows in the transistor 73. In this regard, in the power source monitoring circuit 24, the transistor 72 that is turned on or off in accordance with the standby control signal xSTB is disposed on a path of the steady-state current, so that the steady-state current is inhibited from flowing when the standby control signal xSTB indicating that the block 23 is set to the standby state is supplied. In such a manner, inhibiting the steady-state current from flowing in the power source monitoring circuit 24 in accordance with the standby control signal xSTB can cut down the current consumption of the power source monitoring circuit 24.

Further, in a case where the standby control signal xSTB for setting the block 23 to the standby state is supplied, that is, in a case where the standby control signal xSTB is at L level, the transistor 71 is turned on, and the output signal xPS_OUT thus becomes H level. The transistor 77 is then turned on, and the control signal PS_OUT thus becomes L level.

In such a manner, the transistor 71 is provided to fix the logic of the control signal PS_OUT to L level when the standby control signal xSTB is at L level. Therefore, when the standby control signal xSTB is at L level, the operation of the power source monitoring circuit 24 is stopped, that is, the status of the power source VDDA is not monitored, and the control signal PS_OUT being at L level is constantly output.

In such a manner, when the control signal PS_OUT being at L level is output, the operation status of the level shifter circuit 22 becomes an operation status similar to that of a case where the above-mentioned power source VDDA is not activated, and the digital signal LS_OUT being at H level is output from the level shifter circuit 22 to the block 23. It should be noted that, in this case as well, the block 23 enters the standby state, and the digital signal LS_OUT is not used in the block 23. If the digital signal LS_OUT is fixed to H level, no inconvenience is particularly caused.

As described above, according to the semiconductor device 11, in a case where the block 23 on the output side of the level shifter circuit 22 is in the standby state, it is possible to significantly cut down the steady-state current of the power source monitoring circuit 24 and reduce the current consumption.

For example, many power source systems are present in a semiconductor chip of low current consumption, and a power source monitoring circuit may be mounted to each of the power source systems. In such a case, the steady-state current of those power source monitoring circuits cannot be ignored.

Because of this, the present technology, which is capable of cutting down the steady-state current of the power source monitoring circuit 24 when each of the blocks such as the block 21 and the block 23 is in the standby state, is effective as a technique of reducing the steady-state current. In particular, in an application for a sensor network, a mobile wearable device, or the like, there is a need for cutting down the current consumption of a semiconductor chip to the extreme, and the technique of cutting down the current consumption according to the present technology becomes an effective solving method.

Second Embodiment

Configuration Example of Semiconductor Device

Figure 2:
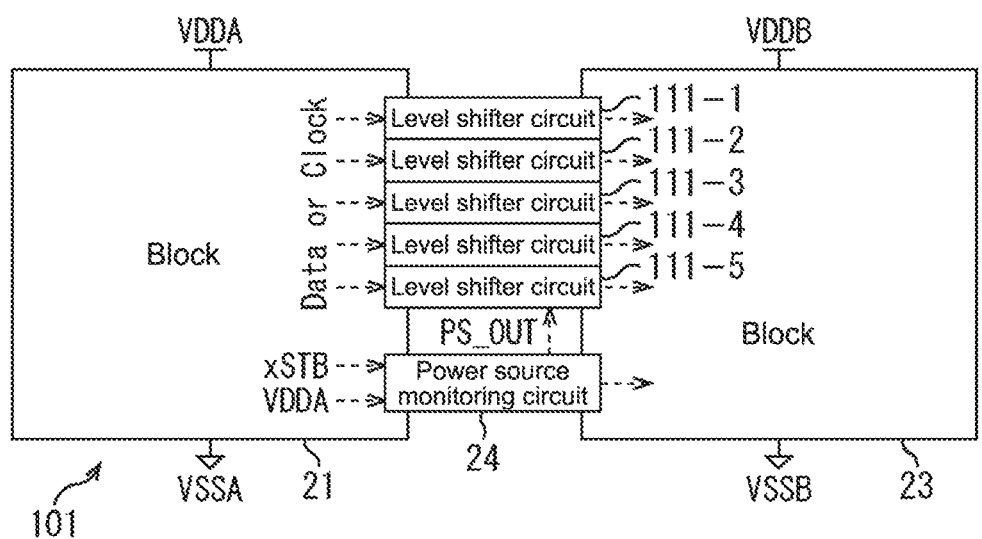
FIG. 2 is a diagram showing another configuration example of the semiconductor device.

It should be noted that the configuration in which the semiconductor device 11 includes one power source monitoring circuit 24 and one level shifter circuit 22 has been described above as an example. However, for example, as shown in FIG. 2, one power source monitoring circuit 24 and a plurality of level shifter circuits may be provided between the blocks that give and receive a digital signal. It should be noted that, in FIG. 2, parts corresponding to the case of FIG. 1 are denoted by the same reference symbols and description thereof will be omitted as appropriate.

A semiconductor device 101 shown in FIG. 2 includes a block 21, a level shifter circuit 111-1 to a level shifter circuit 111-5, a block 23, and a power source monitoring circuit 24.

In this example, the block 21 operates by power supply from a power source VDDA and supplies multiple digital signals to the block 23 via the level shifter circuit 111-1 to the level shifter circuit 111-5, respectively.

The level shifter circuit 111-1 to the level shifter circuit 111-5 each have a similar configuration to, for example, that of the level shifter circuit 22 of FIG. 1, perform level conversion on the digital signals supplied from the block 21, and output resultant digital signals to the block 23. Therefore, those level shifter circuit 111-1 to level shifter circuit 111-5 each perform an operation similar to that of the level shifter circuit 22 described above.

It should be noted that in a case where the level shifter circuit 111-1 to the level shifter circuit 111-5 do not need to be particularly distinguished from one another hereinafter, the level shifter circuit 111-1 to the level shifter circuit 111-5 will also be referred to simply as level shifter circuits 111.

Further, each of the level shifter circuits 111 stops the operation in accordance with the control signal PS_OUT supplied from the power source monitoring circuit 24.

The digital signal supplied from the block 21 to each of the level shifter circuits 111 corresponds to the digital signal LS_IN described in FIG. 1. The digital signal output from each of the level shifter circuits 111 to the block 23 corresponds to the digital signal LS_OUT described in FIG. 1. Therefore, in this case as well, the digital signals level-converted by the level shifter circuits 111 may be any signals such as a clock signal and a data signal.

The block 23 operates by power supply from a power source VDDB and performs an operation corresponding to the digital signals supplied from the block 21 via the level shifter circuit 111-1 to the level shifter circuit 111-5.

The power source monitoring circuit 24 operates by power supply from the power source VDDB, generates the control signal PS_OUT and the standby control signal xSTB_OUT in accordance with the status of the power source VDDA and the standby control signal xSTB that specifies the operation status of the block 23, and outputs those signals. In other words, the power source monitoring circuit 24 supplies the same control signal PS_OUT to each of the level shifter circuits 111 to control the operations of those level shifter circuits 111, and also supplies the standby control signal xSTB_OUT to the block 23 to set the block 23 to the standby state as needed.

In such a manner, providing the multiple level shifter circuits 111 to the semiconductor device 101 and controlling those level shifter circuits 111 by one control signal PS_OUT output from the power source monitoring circuit 24 can also significantly cut down the steady-state current of the power source monitoring circuit 24. Further, the current consumption can thus be reduced.

Third Embodiment

Configuration Example of Semiconductor Device

Furthermore, in a semiconductor device, multiple digital signals output from a block at the front stage may be supplied to blocks different from one another at the rear stage.

Figure 3:
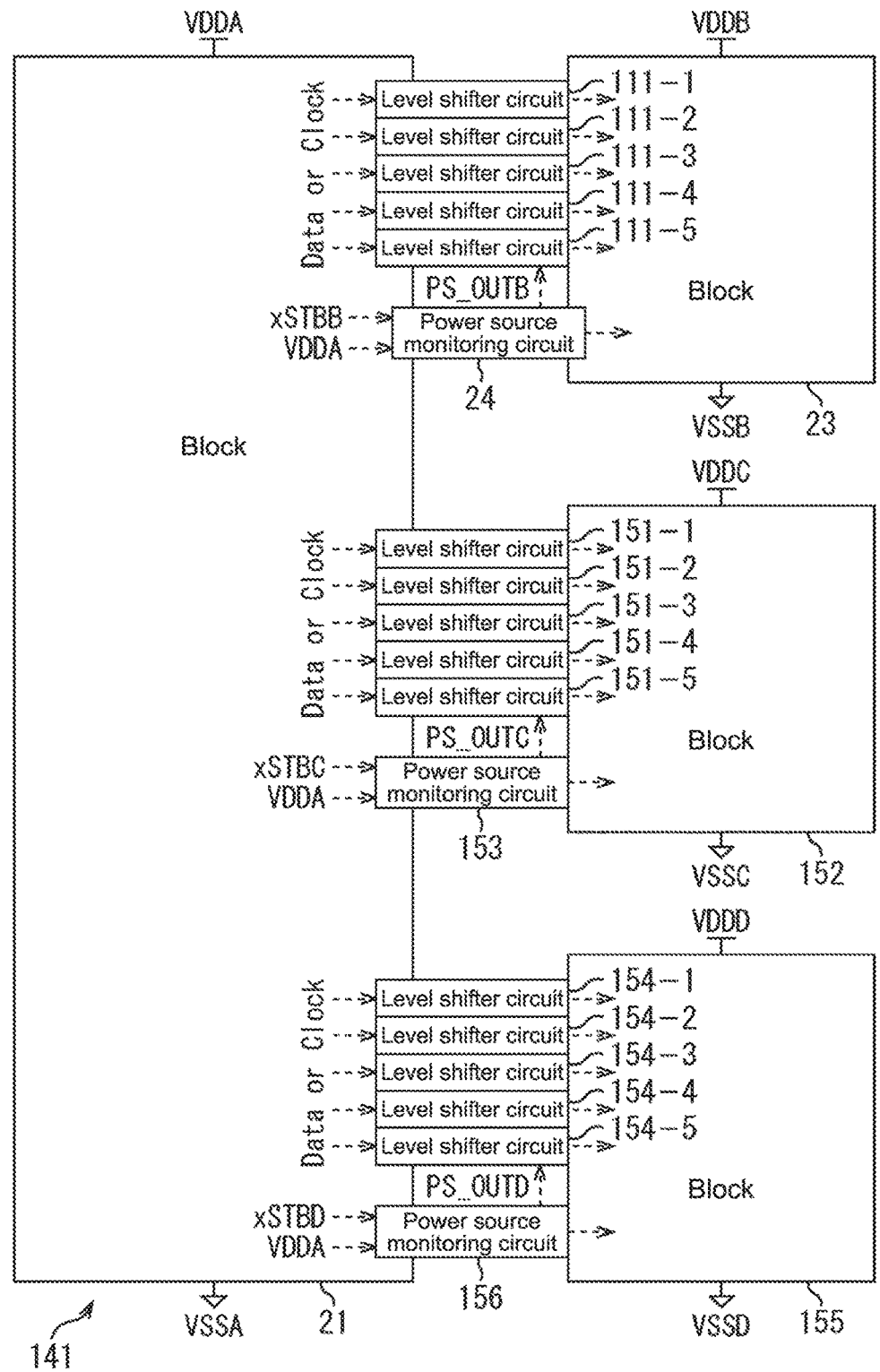
FIG. 3 is a diagram showing another configuration example of the semiconductor device.

In such a case, the semiconductor device is configured as shown in, for example, FIG. 3. It should be noted that, in FIG. 3, parts corresponding to the case of FIG. 2 are denoted by the same reference symbols and description thereof will be omitted as appropriate.

A semiconductor device 141 shown in FIG. 3 includes a block 21, a level shifter circuit 111-1 to a level shifter circuit 111-5, a block 23, a power source monitoring circuit 24, a level shifter circuit 151-1 to a level shifter circuit 151-5, a block 152, a power source monitoring circuit 153, a level shifter circuit 154-1 to a level shifter circuit 154-5, a block 155, and a power source monitoring circuit 156.

In this example, the block 21 supplies digital signals to the block 23 via the level shifter circuits 111, and also supplies other multiple digital signals to the block 152 via the respective level shifter circuit 151-1 to level shifter circuit 151-5. Further, the block 21 also supplies still other multiple digital signals to the block 155 via the respective level shifter circuit 154-1 to level shifter circuit 154-5.

In other words, in the semiconductor device 141, the level shifter circuits and the power source monitoring circuit are provided for each of the blocks to be output destinations of the digital signals from the block 21.

It should be noted that in a case where the level shifter circuit 151-1 to the level shifter circuit 151-5 do not need to be particularly distinguished from one another hereinafter, the level shifter circuit 151-1 to the level shifter circuit 151-5 will also be referred to simply as level shifter circuits 151, and in a case where the level shifter circuit 154-1 to the level shifter circuit 154-5 do not need to be particularly distinguished from one another, the level shifter circuit 154-1 to the level shifter circuit 154-5 will also be referred to simply as level shifter circuits 154.

Further, in FIG. 3, the standby control signal xSTB supplied to the power source monitoring circuit 24 is described as a standby control signal xSTBB in order to be distinguished from standby control signals of other blocks. Similarly, the control signal PS_OUT output from the power source monitoring circuit 24 is described as a control signal PS_OUTB in order to be distinguished from control signals output from other power source monitoring circuits.

The level shifter circuit 151-1 to the level shifter circuit 151-5 operate by power supply from a power source VDDC having a different power source voltage from those of the power source VDDA and the power source VDDB.

Specifically, the level shifter circuit 151-1 to the level shifter circuit 151-5 perform level conversion on the digital signals supplied from the block 21 and supply resultant digital signals to the block 152. Further, each of the level shifter circuits 151 stops the operation in accordance with a control signal PS_OUTC supplied from the power source monitoring circuit 153.

It should be noted that a configuration of each of the level shifter circuits 151 is similar to a configuration of the level shifter circuit 22 shown in FIG. 1, and each of the level shifter circuits 151 performs an operation similar to that of the level shifter circuit 22.

The block 152 operates by power supply from the power source VDDC and performs an operation corresponding to the digital signals supplied from the block 21 via the level shifter circuit 151-1 to the level shifter circuit 151-5.

The power source monitoring circuit 153 operates by power supply from the power source VDDC, generates the control signal PS_OUTC and a standby control signal xSTB_OUTC in accordance with a status of the power source VDDA and a standby control signal xSTBC that specifies an operation status of the block 152, and outputs those signals.

In other words, the power source monitoring circuit 153 supplies the same control signal PS_OUTC to each of the level shifter circuits 151 to control the operations of those level shifter circuits 151, and also supplies the standby control signal xSTB_OUTC to the block 152 to set the block 152 to the standby state as needed. Here, the same control signal PS_OUTC is supplied to each of the level shifter circuits 151. Further, the configuration and operation of the power source monitoring circuit 153 are similar to the configuration and operation of the power source monitoring circuit 24.

The level shifter circuit 154-1 to the level shifter circuit 154-5 operate by power supply from a power source VDDD having a different power source voltage from those of the power source VDDA to the power source VDDC.

Specifically, the level shifter circuit 154-1 to the level shifter circuit 154-5 perform level conversion on the digital signals supplied from the block 21 and supply resultant digital signals to the block 155. Further, each of the level shifter circuits 154 stops the operation in accordance with a control signal PS_OUTD supplied from the power source monitoring circuit 156.

It should be noted that a configuration of each of the level shifter circuits 154 is similar to a configuration of the level shifter circuit 22 shown in FIG. 1, and each of the level shifter circuits 154 performs an operation similar to that of the level shifter circuit 22.

The block 155 operates by power supply from the power source VDDD and performs an operation corresponding to the digital signals supplied from the block 21 via the level shifter circuit 154-1 to the level shifter circuit 154-5.

The power source monitoring circuit 156 operates by power supply from the power source VDDD, generates the control signal PS_OUTD and a standby control signal xSTB_OUTD in accordance with the status of the power source VDDA and a standby control signal xSTBD that specifies an operation status of the block 155, and outputs those signals.

In other words, the power source monitoring circuit 156 supplies the same control signal PS_OUTD to each of the level shifter circuits 154 to control the operations of those level shifter circuits 154, and also supplies the standby control signal xSTB_OUTD to the block 155 to set the block 155 to the standby state as needed. Here, the same control signal PS_OUTD is supplied to each of the level shifter circuits 154. Further, the configuration and operation of the power source monitoring circuit 156 are similar to the configuration and operation of the power source monitoring circuit 24.

As described above, in the semiconductor device 141, the block 23, the block 152, and the block 155 that are provided on the output side of the respective level shifter circuits are controlled by the standby control signals different from one another. That is to say, the semiconductor device 141 can independently control the block 23, the block 152, and the block 155 to be set to the standby state.

Further, in the semiconductor device 141, the power source monitoring circuit is connected one by one to each of the blocks. In other words, the power source monitoring circuit 24, the power source monitoring circuit 153, and the power source monitoring circuit 156 are respectively connected to the block 23, the block 152, and the block 155. Furthermore, in the semiconductor device 141, the block 23, the block 152, and the block 155 are respectively connected to the power source VDDB, the power source VDDC, and the power source VDDD that are different from one another, operate by power supply from those power sources (power source systems).

Fourth Embodiment

Configuration Example of Semiconductor Device

Figure 4:
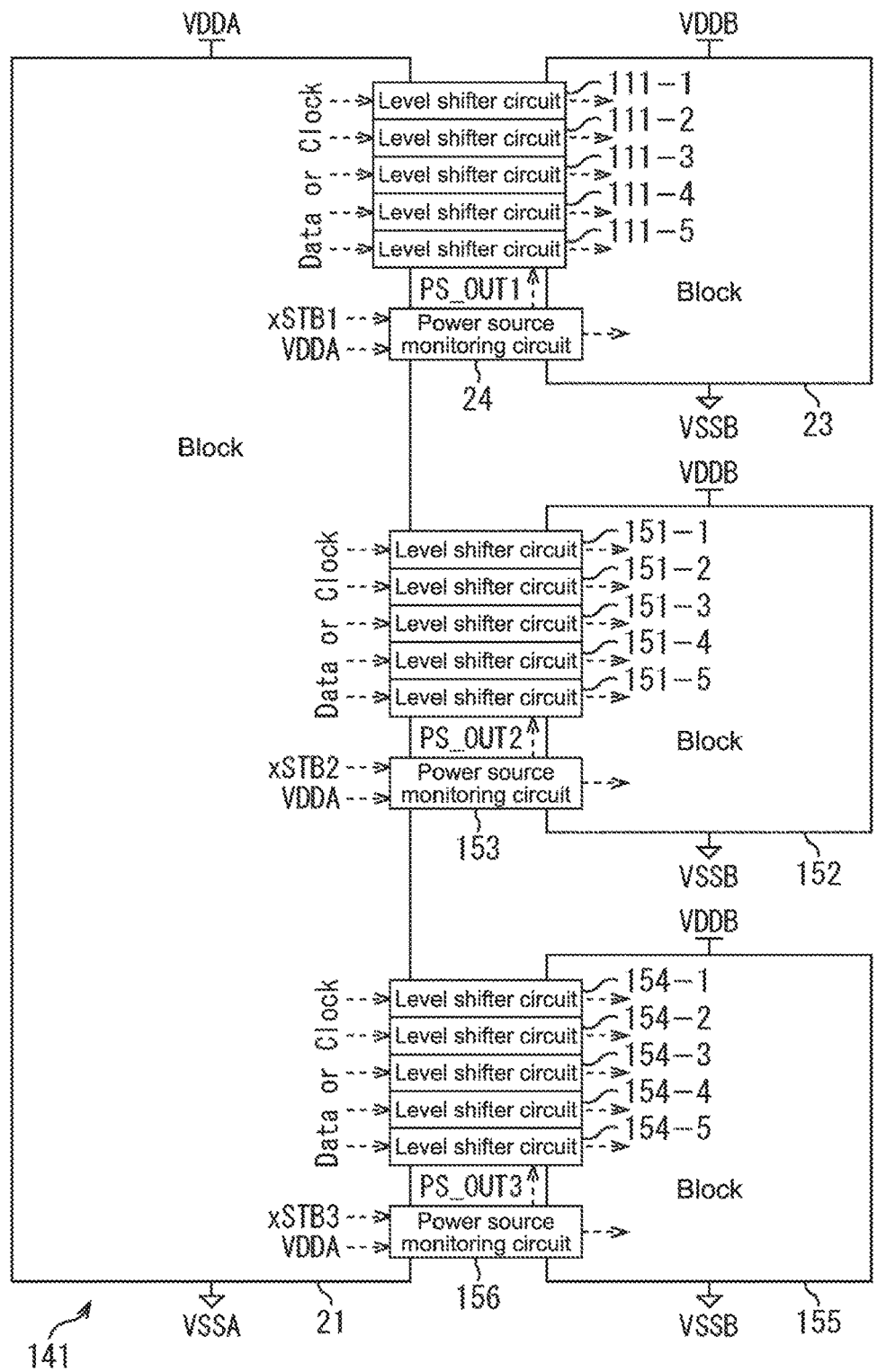
FIG. 4 is a diagram showing another configuration example of the semiconductor device.

It should be noted that in the third embodiment the example in which the block 23, the block 152, and the block 155 at the rear stage operate by the power source systems different from one another has been described. However, for example, as shown in FIG. 4, those block 23, block 152, and block 155 may be configured to operate by the same power source system. It should be noted that, in FIG. 4, parts corresponding to the case of FIG. 3 are denoted by the same reference symbols and description thereof will be omitted as appropriate.

A semiconductor device 141 shown in FIG. 4 includes a block 21, a level shifter circuit 111-1 to a level shifter circuit 111-5, a block 23, a power source monitoring circuit 24, a level shifter circuit 151-1 to a level shifter circuit 151-5, a block 152, a power source monitoring circuit 153, a level shifter circuit 154-1 to a level shifter circuit 154-5, a block 155, and a power source monitoring circuit 156.

In other words, the semiconductor device 141 shown in FIG. 4 has a similar configuration to that of the semiconductor device 141 shown in FIG. 3. However, in the example of FIG. 4, the block 23, the block 152, and the block 155 operate by power supply from the same power source VDDB.

Therefore, each of the level shifter circuits 111, level shifter circuits 151, and level shifter circuits 154 also operates by power supply from the power source VDDB.

Further, the power source monitoring circuit 24 operates by power supply from the power source VDDB. In other words, the power source monitoring circuit 24 supplies a control signal PS_OUT1 to each of the level shifter circuits 111 in accordance with a status of a power source VDDA and a standby control signal xSTB1 that specifies an operation status of the block 23, and also generates a standby control signal xSTB_OUT1 and supplies the standby control signal xSTB_OUT1 to the block 23. Therefore, the level shifter circuits 111 stop the operations in accordance with the control signal PS_OUT1, and the block 23 enters a standby state in accordance with the standby control signal xSTB_OUT1.

Similarly, the power source monitoring circuit 153 operates by power supply from the power source VDDB. In other words, the power source monitoring circuit 153 supplies a control signal PS_OUT2 to each of the level shifter circuits 151 in accordance with the status of the power source VDDA and a standby control signal xSTB2 that specifies an operation status of the block 152, and also generates a standby control signal xSTB_OUT2 and supplies the standby control signal xSTB_OUT2 to the block 152. Therefore, the level shifter circuits 151 stop the operations in accordance with the control signal PS_OUT2, and the block 152 enters a standby state in accordance with the standby control signal xSTB_OUT2.

Furthermore, the power source monitoring circuit 156 operates by power supply from the power source VDDB. In other words, the power source monitoring circuit 156 supplies a control signal PS_OUT3 to each of the level shifter circuits 154 in accordance with the status of the power source VDDA and a standby control signal xSTB3 that specifies an operation status of the block 155, and also generates a standby control signal xSTB_OUT3 and supplies the standby control signal xSTB_OUT3 to the block 155. Therefore, the level shifter circuits 154 stop the operations in accordance with the control signal PS_OUT3, and the block 155 enters a standby state in accordance with the standby control signal xSTB_OUT3.

It should be noted that the examples shown in FIGS. 3 and 4, in which the plurality of level shifter circuits are provided between the block 21 and each block to which the digital signals output from the block 21 and then level-converted is supplied, have been described. However, the level shifter circuit to be provided may be one. Further, in FIG. 4, the case where the block 23, the block 152, and the block 155 receive power supply from the same power source VDDB has been described as an example. However, those blocks may receive power supply from power sources that are different from one another but have the same power source voltage, a voltage VDDB.

Fifth Embodiment

Configuration Example of Semiconductor Device

Further, in a semiconductor device, a power gate switch may be connected to a block on the input side of the level shifter circuits, and power supply to the block on the input side may be controlled. In such a case, an input of a power source monitoring circuit is connected to not a power source but a virtual power source.

Figure 5:
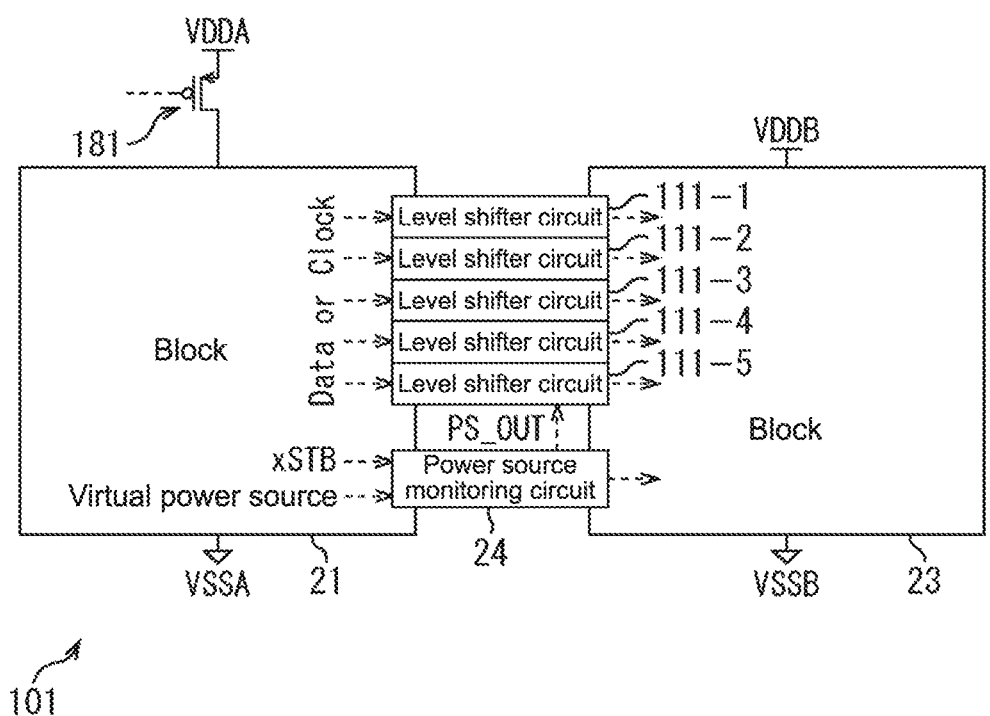
FIG. 5 is a diagram showing another configuration example of the semiconductor device.

In such a manner, in a case where a power gate switch is connected to a block on the input side, the semiconductor device is configured as shown in, for example, FIG. 5. It should be noted that, in FIG. 5, parts corresponding to the case of FIG. 2 are denoted by the same reference symbols and description thereof will be omitted as appropriate.

A semiconductor device 101 shown in FIG. 5 includes a block 21, a power gate switch 181, a level shifter circuit 111-1 to a level shifter circuit 111-5, a block 23, and a power source monitoring circuit 24.

A configuration of the semiconductor device 101 shown in FIG. 5 is different from the configuration of the semiconductor device 101 of FIG. 2 in that the power gate switch 181 is newly provided, and is similar to the configuration of the semiconductor device 101 of FIG. 2 in other points.

In this example, in the semiconductor device 101, the power gate switch 181 is connected to the block 21. In other words, the block 21 is connected to a power source VDDA via the power gate switch 181, and the power gate switch 181 functions as a power source supply control unit when power is supplied from the power source VDDA to the block 21.

The power gate switch 181 is constituted of, for example, a PMOS transistor and is turned on or off in accordance with a power gate control signal that is supplied from the semiconductor device 101 to a gate of the power gate switch 181. In other words, the power gate switch 181 enters an electrically continuous state or a non-electrically continuous state in accordance with the power gate control signal.

Specifically, in a case where the power gate control signal is at L level, the power gate switch 181 is turned on, and power is supplied from the power source VDDA to the block 21. In contrast to this, in a case where the power gate control signal is at H level, the power gate switch 181 is turned off, and the power source VDDA and the block 21 are disconnected from each other.

Therefore, it can be said that the block 21 is connected to a virtual power source between the power gate switch 181 and the block 21. The power source monitoring circuit 24 generates a control signal PS_OUT and a standby control signal xSTB_OUT in accordance with a status of the virtual power source and a standby control signal xSTB that specifies an operation status of the block 23, and outputs those signals.

For example, in a state where the power gate control signal is a signal at L level and the block 21 and the power source VDDA are connected to each other via the power gate switch 181, the virtual power source is in an activated state. Conversely, in a case where the power gate control signal is a signal at H level and the block 21 and the power source VDDA are disconnected from each other by the power gate switch 181, the virtual power source is not in the activated state.

Sixth Embodiment

Configuration Example of Semiconductor Device

It should be noted that in the fifth embodiment the example in which the power gate switch is connected to the block on the input side of the level shifter circuits has been described. However, the power gate switch may be connected to a block on the output side of the level shifter circuits.

Figure 6:
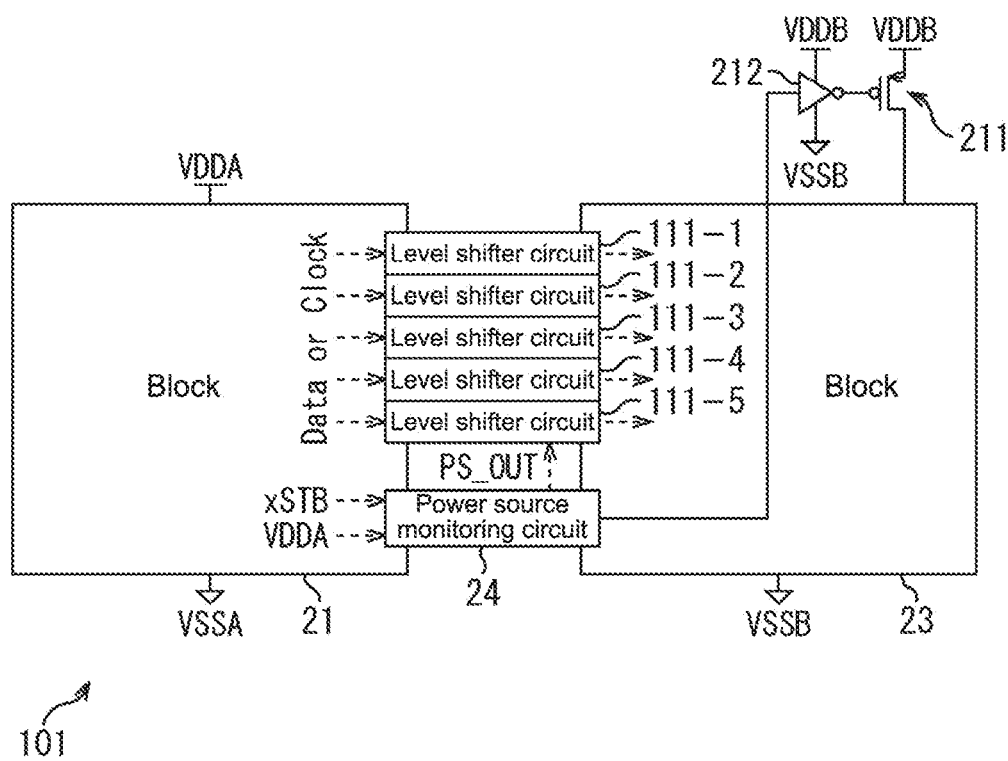
FIG. 6 is a diagram showing another configuration example of the semiconductor device.

In such a case, the semiconductor device is configured as shown in, for example, FIG. 6. It should be noted that, in FIG. 6, parts corresponding to the case of FIG. 2 are denoted by the same reference symbols and description thereof will be omitted as appropriate.

A semiconductor device 101 shown in FIG. 6 includes a block 21, a level shifter circuit 111-1 to a level shifter circuit 111-5, a block 23, a power gate switch 211, an inverter 212, and a power source monitoring circuit 24.

A configuration of the semiconductor device 101 shown in FIG. 6 is different from the configuration of the semiconductor device 101 of FIG. 2 in that the power gate switch 211 and the inverter 212 are newly provided, and is similar to the configuration of the semiconductor device 101 of FIG. 2 in other points.

In this example, in the semiconductor device 101, the power gate switch 211 is connected to the block 23. In other words, the block 23 is connected to a power source VDDB via the power gate switch 211, and the power gate switch 211 functions as a power supply control unit when power is supplied from the power source VDDB to the block 23.

The power gate switch 211 is constituted of, for example, a PMOS transistor and is turned on or off in accordance with a power gate control signal that is supplied from the inverter 212 to a gate of the power gate switch 211. In other words, the power gate switch 211 enters an electrically continuous state or a non-electrically continuous state in accordance with the power gate control signal.

Therefore, it can be said that the block 23 is connected to a virtual power source between the power gate switch 211 and the block 23. The block 23 enters a standby state in accordance with the status of the virtual power source.

Specifically, in the semiconductor device 101, a standby control signal xSTB_OUT output from the power source monitoring circuit 24 is supplied to the inverter 212. The inverter 212 inverts the standby control signal xSTB_OUT supplied from the power source monitoring circuit 24 to obtain a power gate control signal, and supplies the power gate control signal to the gate of the power gate switch 211.

For example, in a case where the standby control signal xSTB_OUT is at L level at which the block 23 is set to the standby state, the power gate control signal becomes H level. Thus, the power gate switch 211 is turned off, and the block 23 and the power source VDDB are set to a disconnected state. That is to say, the virtual power source is not activated. In this case, since power supply from the power source VDDB to the block 23 is not performed, the block 23 enters the standby state.

Meanwhile, in a case where the standby control signal xSTB_OUT is at H level at which the block 23 is caused to normally operate, the power gate control signal becomes L level. Thus, the power gate switch 211 is turned on, and the block 23 and the power source VDDB are set to a connected state. That is to say, the virtual power source is activated. In this case, since power supply from the power source VDDB to the block 23 is performed, the block 23 normally operates.

As described above, in the semiconductor device 101 shown in FIG. 6, the standby control signal xSTB_OUT output from the power source monitoring circuit 24 is used for controlling opening and closing of the power gate switch 211, and the power supply to the block 23 is controlled.

It should be noted that in FIG. 6 the configuration in which the block 23 is provided with the power gate switch 211 has been described. However, a configuration in which the block 23 is provided with the power gate switch 211 and the block 21 is provided with the power gate switch 181 shown in FIG. 5 may be provided.

Another Configuration Example 1 of Power Source Monitoring Circuit

Further, the above has described that the power source monitoring circuit 24 has the configuration shown in FIG. 1, and the power source monitoring circuit 153 and the power source monitoring circuit 156 also have the configuration similar to that of the power source monitoring circuit 24 shown in FIG. 1. However, those power source monitoring circuits may have any configuration as long as the control signal supplied to the level shifter circuit and the standby control signal supplied to the block at the rear stage are obtained on the basis of the status of the power source of the block at the front stage and the standby control signal to the block at the rear stage, and the steady-state current can be cut down.

Figure 7:
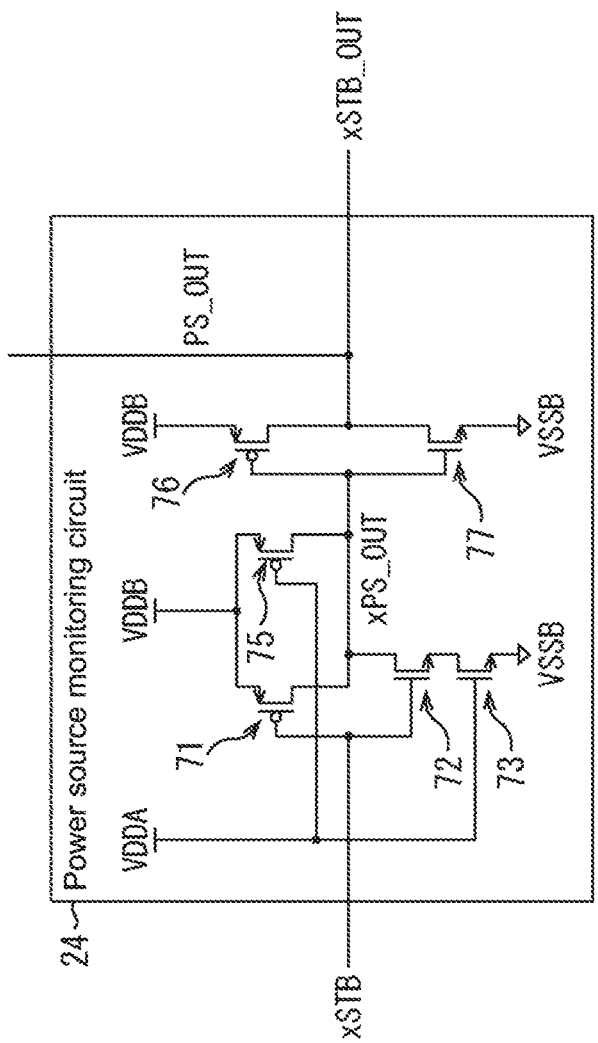
FIG. 7 is a diagram showing another configuration example of a power source monitoring circuit.

Specifically, the power source monitoring circuit 24 may be configured as shown in, for example, FIG. 7. It should be noted that, in FIG. 7, parts corresponding to the case of FIG. 1 are denoted by the same reference symbols and description thereof will be omitted as appropriate.

A power source monitoring circuit 24 shown in FIG. 7 is constituted of a transistor 71 to a transistor 73, and a transistor 75 to a transistor 77. A configuration of the power source monitoring circuit 24 shown in FIG. 7 is different from the configuration of the power source monitoring circuit 24 shown in FIG. 1 in that the power source monitoring circuit 24 of FIG. 7 is not provided with the resistor 74, and is the same as the configuration of the power source monitoring circuit 24 shown in FIG. 1 in other points.

For example, in a case where a power source voltage (voltage VDDB) of a power source VDDB is larger than a power source voltage (voltage VDDA) of a power source VDDA, a gate-source voltage in the transistor 71 of the power source monitoring circuit 24 becomes large, and even when a standby control signal xSTB is at H level, a current flows in the transistor 71. In this regard, in order to adjust an input threshold level of the transistor 71, the resistor 74 is provided in the power source monitoring circuit 24 shown in FIG. 1.

However, in a case where a voltage difference between the voltage VDDA and the voltage VDDB is not so large, when the standby control signal xSTB is at H level, a current does not flow in the transistor 71. Thus, a configuration without the resistor 74 can be provided as shown in FIG. 7.

Another Configuration Example 2 of Power Source Monitoring Circuit

Figure 8:
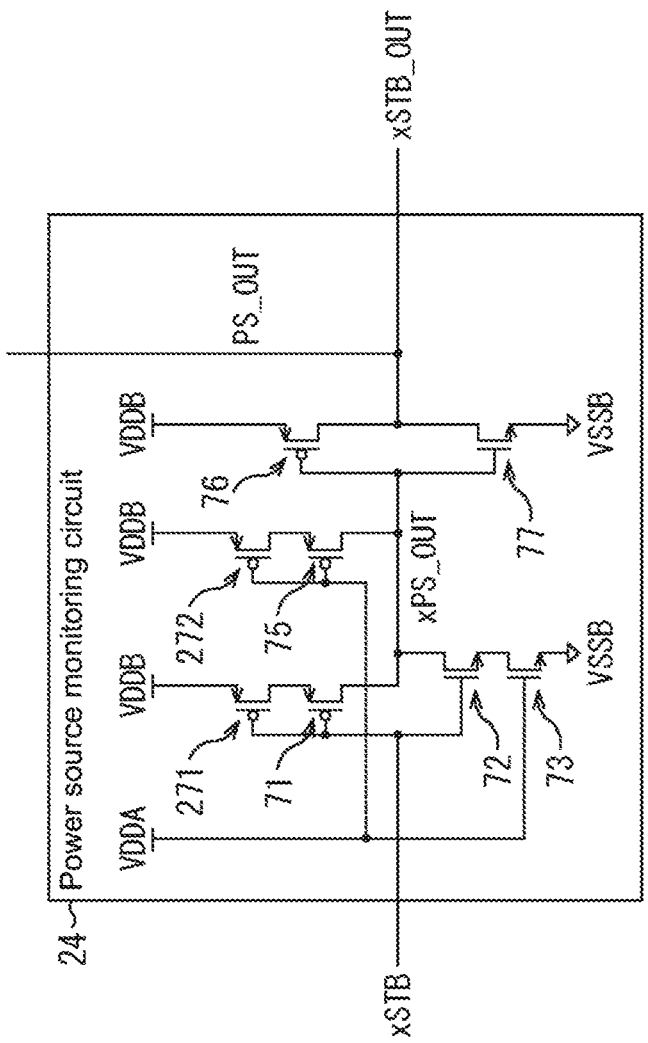
FIG. 8 is a diagram showing another configuration example of the power source monitoring circuit.

Further, the power source monitoring circuit 24 may be configured as shown in FIG. 8. It should be noted that, in FIG. 8, parts corresponding to the case of FIG. 1 are denoted by the same reference symbols and description thereof will be omitted as appropriate.

A power source monitoring circuit 24 shown in FIG. 8 is constituted of a transistor 71 to a transistor 73, a transistor 75 to a transistor 77, a transistor 271, and a transistor 272. A configuration of the power source monitoring circuit 24 shown in FIG. 8 is different from the configuration of the power source monitoring circuit 24 shown in FIG. 1 in that the power source monitoring circuit 24 of FIG. 8 is not provided with the resistor 74 and is newly provided with the transistor 271 and the transistor 272. In other points, the configuration of the power source monitoring circuit 24 shown in FIG. 8 is the same as the configuration of the power source monitoring circuit 24 shown in FIG. 1.

In the example of FIG. 8, the transistor 271 is further provided between the transistor 71 and a power source VDDB, and a standby control signal xSTB is supplied to a gate of the transistor 271. The transistor 271 is provided as a PMOS transistor.

In such a manner, disposing the transistor 71 and the transistor 271 side by side between the transistor 72 and the power source VDDB can make a current difficult to flow in the transistor 71 without providing the resistor 74. In such a manner, a cascode circuit is constituted of the transistor 71 and the transistor 271, to thus adjust an input threshold level of the transistor 71.

Similarly, in the power source monitoring circuit 24 shown in FIG. 8, the transistor 272 is further provided between the transistor 75 and the power source VDDB, and a gate of the transistor 272 is connected to a power source VDDA. The transistor 272 is provided as a PMOS transistor.

In such a manner, disposing the transistor 75 and the transistor 272 side by side between the transistor 72 and the power source VDDB can make a current difficult to flow in the transistor 75 without providing the resistor 74. In such a manner, a cascode circuit is constituted of the transistor 75 and the transistor 272, to thus adjust an input threshold level of the transistor 75.

It should be noted that the two-stage cascode connection of the PMOS transistors has been described here for the part of the transistor 71 and the part of the transistor 75. However, the cascode connection of two or more stages of the transistors may be provided in accordance with the magnitude of an input threshold level to be adjusted.

Further, the configuration shown in FIG. 7 or FIG. 8 may be provided to not only the power source monitoring circuit 24 but also the power source monitoring circuit 153 or the power source monitoring circuit 156.

Another Configuration Example 1 of Level Shifter Circuit

Further, the level shifter circuit 22 may have any configuration as long as the level shifter circuit 22 has a circuit configuration that is capable of performing level conversion of a digital signal and stops an operation in accordance with the control signal PS_OUT.

Figure 9:
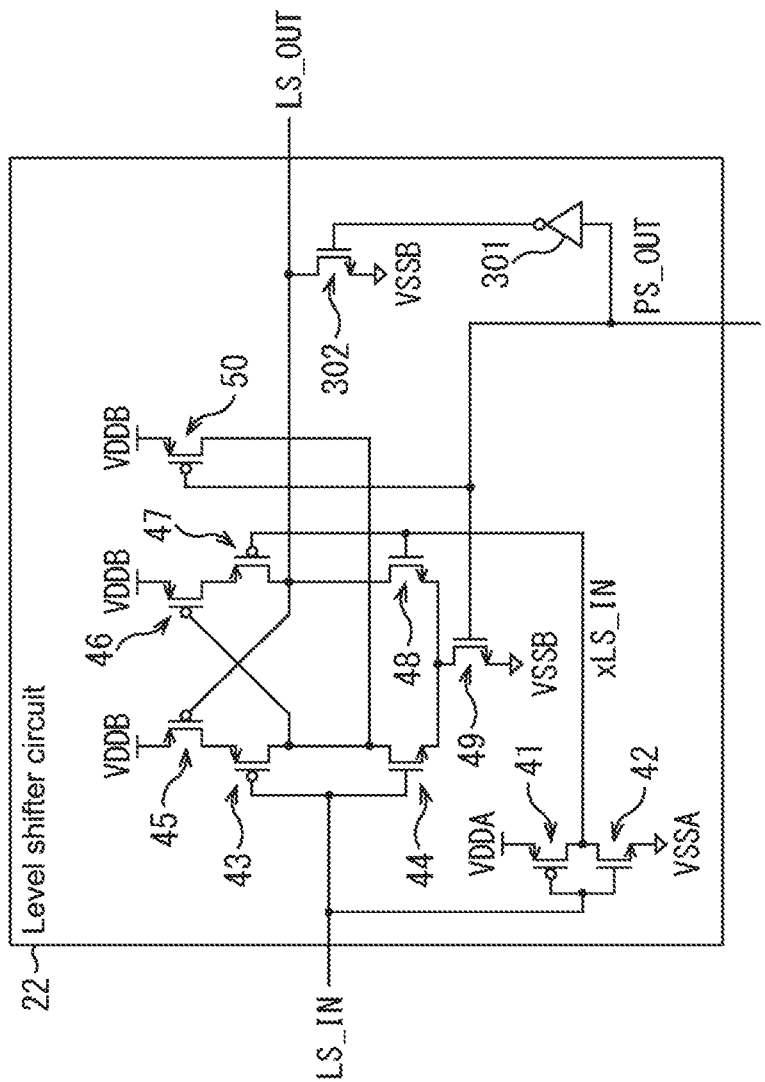
FIG. 9 is a diagram showing another configuration example of a level shifter circuit.

For example, the level shifter circuit 22 may be configured as shown in FIG. 9. It should be noted that, in FIG. 9, parts corresponding to the case of FIG. 1 are denoted by the same reference symbols and description thereof will be omitted as appropriate.

A level shifter circuit 22 shown in FIG. 9 is constituted of a transistor 41 to a transistor 50, an inverter 301, and a transistor 302.

A configuration of the level shifter circuit 22 shown in FIG. 9 is different from the configuration of the level shifter circuit 22 of FIG. 1 in that the inverter 301 and the transistor 302 are provided instead of the transistor 51 in the configuration of the level shifter circuit 22 of FIG. 1. In other points, the configuration of the level shifter circuit 22 shown in FIG. 9 is the same as the configuration of the level shifter circuit 22 of FIG. 1.

In this example, a control signal PS_OUT output from the power source monitoring circuit 24 is supplied to the inverter 301. The inverter 301 inverts the control signal PS_OUT supplied from the power source monitoring circuit 24 and supplies a resultant signal to a gate of the transistor 302.

Further, the transistor 302 is constituted of an NMOS transistor. A source of the transistor 302 is connected to the ground of a potential VSSB, and a drain of the transistor 302 is connected to drains of the transistor 47 and the transistor 48.

Therefore, for example, when the control signal PS_OUT is at L level, the transistor 302 is turned on. As a result, a digital signal LS_OUT output to the block 23 is fixed to L level (potential VSSB).

Conversely, when the control signal PS_OUT is at H level, the transistor 302 is turned off, and a digital signal LS_OUT corresponding to the level of the digital signal LS_IN is output from the transistor 47 or the transistor 48.

As described above, the configuration shown in FIG. 1 is a configuration in which the digital signal LS_OUT becomes H level in a case where the control signal PS_OUT is at L level, while the configuration shown in FIG. 9 is a configuration in which the digital signal LS_OUT becomes L level in a case where the control signal PS_OUT is at L level.

Depending on the configuration of the block 23 on the output side of the level shifter circuit 22, a favorable level of L level or H level for the digital signal LS_OUT may differ in a case where the block 23 is in the standby state. Therefore, the configuration of the level shifter circuit 22 may be determined in accordance with the configuration of the block 23.

Another Configuration Example 2 of Level Shifter Circuit

Figure 10:
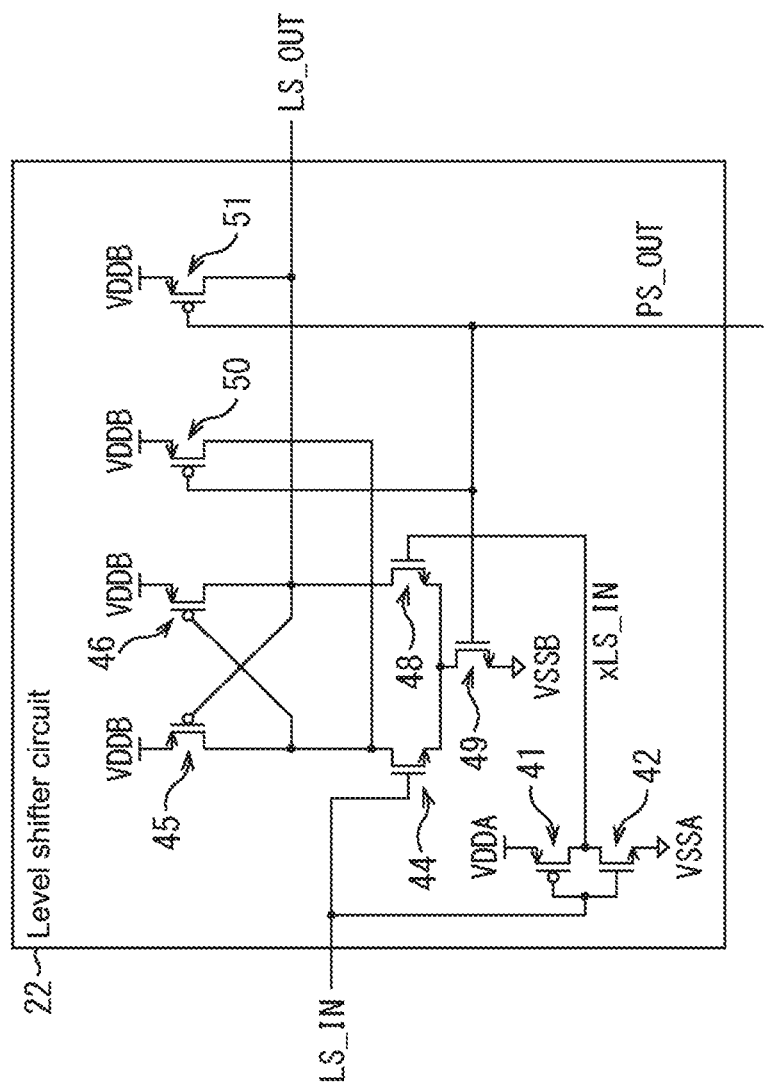
FIG. 10 is a diagram showing another configuration example of the level shifter circuit.

Further, the level shifter circuit 22 may be configured as shown in FIG. 10. It should be noted that, in FIG. 10, parts corresponding to the case of FIG. 1 are denoted by the same reference symbols and description thereof will be omitted as appropriate.

A level shifter circuit 22 shown in FIG. 10 is constituted of a transistor 41, a transistor 42, a transistor 44 to a transistor 46, and a transistor 48 to a transistor 51.

A configuration of the level shifter circuit 22 shown in FIG. 10 is different from the configuration of the level shifter circuit 22 of FIG. 1 in that the transistor 43 and the transistor 47 are not provided. In other points, the configuration of the level shifter circuit 22 shown in FIG. 10 is the same as the configuration of the level shifter circuit 22 of FIG. 1.

The level shifter circuit 22 shown in FIG. 10 is not provided with the transistor 43 and the transistor 47, and performs an operation similar to that of the level shifter circuit 22 shown in FIG. 1.

Another Configuration Example 3 of Level Shifter Circuit

Figure 11:
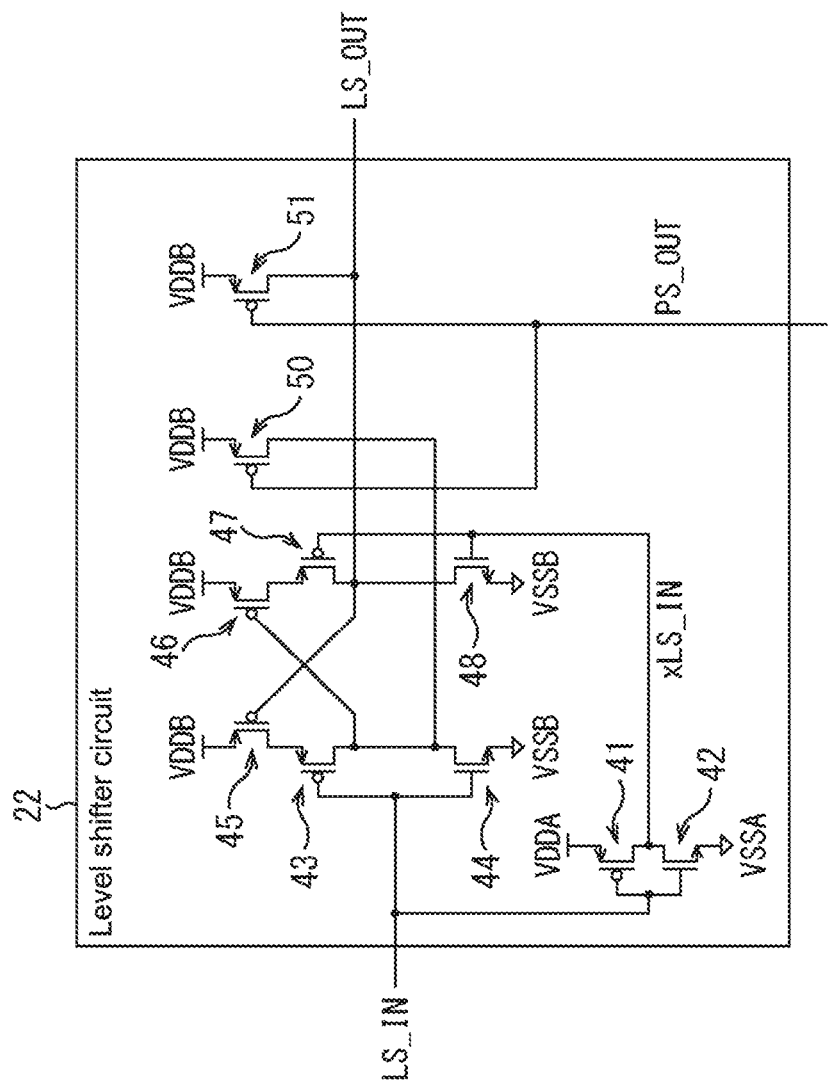
FIG. 11 is a diagram showing another configuration example of the level shifter circuit.

Furthermore, the level shifter circuit 22 may be configured as shown in FIG. 11. It should be noted that, in FIG. 11, parts corresponding to the case of FIG. 1 are denoted by the same reference symbols and description thereof will be omitted as appropriate.

A level shifter circuit 22 shown in FIG. 11 is constituted of a transistor 41 to a transistor 48, a transistor 50, and a transistor 51.

A configuration of the level shifter circuit 22 shown in FIG. 11 is different from the configuration of the level shifter circuit 22 of FIG. 1 in that the transistor 49 is not provided, and is the same as the configuration of the level shifter circuit 22 of FIG. 1 in other points.

In the examples shown in FIGS. 1 and 11, when the control signal PS_OUT is at L level, the logic of the digital signal LS_OUT is fixed to H level by the transistor 51, and the logic of the drain of the transistor 44 is fixed to H level (voltage VDDB) by the transistor 50.

Because of this, even if the transistor 49 that controls connection between the transistors 44 and 48 and the ground of the potential VSSB is not provided from the beginning, a through current does not flow in the level shifter circuit 22, that is, the transistor 44 and the transistor 48. For that reason, the level shifter circuit 22 shown in FIG. 11 has a configuration without the transistor 49.

It should be noted that the level shifter circuits 111, the level shifter circuits 151, and the level shifter circuits 154 may also be configured as shown in FIG. 9, 10, or 11 similarly to the level shifter circuit 22.

As described above, according to the present technology, in a power source monitoring circuit for reducing a through current in a level shifter circuit that converts the level of a signal output from a front-stage block and outputs the signal to a rear-stage block, it is possible to reduce a steady-state current by stopping the operation of the power source monitoring circuit itself in accordance with a status of a power source of the front-stage block and an operation status of the rear-stage block.

Seventh Embodiment

<About Leakage Current>

Incidentally, in an electronic apparatus or the like, when a power source is activated, power on reset (POR) by which each unit of a semiconductor chip mounted in the electronic apparatus or the like is kept in a reset state until the power source is stabilized is performed. To generate a reset signal for performing such power on reset, a power on reset circuit is used.

For example, there are proposed technologies capable of obtaining a reset signal having a sufficient pulse width by using delay of a counter circuit so as to execute stable reset in a power on reset circuit (see, for example, Japanese Patent Application Laid-open No. Hei 5-291915, Japanese Patent Application Laid-open No. Hei 10-313240, Japanese Patent Application Laid-open No. Hei 11-163702, and Japanese Patent Application Laid-open No. 2004-260648).

However, in the technologies described above, if a sufficient pulse width of the reset signal is intended to be ensured, the circuit size of the counter circuit is increased. As a result, a leakage current of the counter circuit is increased.

The counter circuit is often designed using a standard cell, and an L length (gate length) of an MOS (Metal Oxide Semiconductor) transistor used in the standard cell is generally short in many cases. Because of this, when designing is performed using the standard cell, a leakage current of the counter circuit is made large in many cases.

Further, even if a MOS transistor having a long L length is used to design a custom counter circuit in order to reduce the leakage current, a layout area of the counter circuit becomes very large.

In this regard, in view of the circumstances as described above, the present technology has been made so as to reduce the leakage current.

According to the present technology as described above, it is possible to reduce the leakage current.

Hereinafter, embodiments to which the present technology is applied will be described with reference to the drawings.

Configuration Example of Power on Reset Circuit

The present technology is to reduce a leakage current while sufficiently ensuring a pulse width of a reset signal by controlling power supply to each of a counter and an oscillation circuit with use of a power gate switch in a power on reset circuit. The counter counts time for which a reset state is kept. The oscillation circuit supplies a clock signal to the counter.

The present technology as described above can be applied to various electronic apparatuses including not only the power on reset circuit but also a semiconductor device equipped with the power on reset circuit, a network device including the semiconductor device, a sensor network, a mobile wearable device, a portable device such as a mobile phone, an imaging apparatus, and the like.

Figure 12:
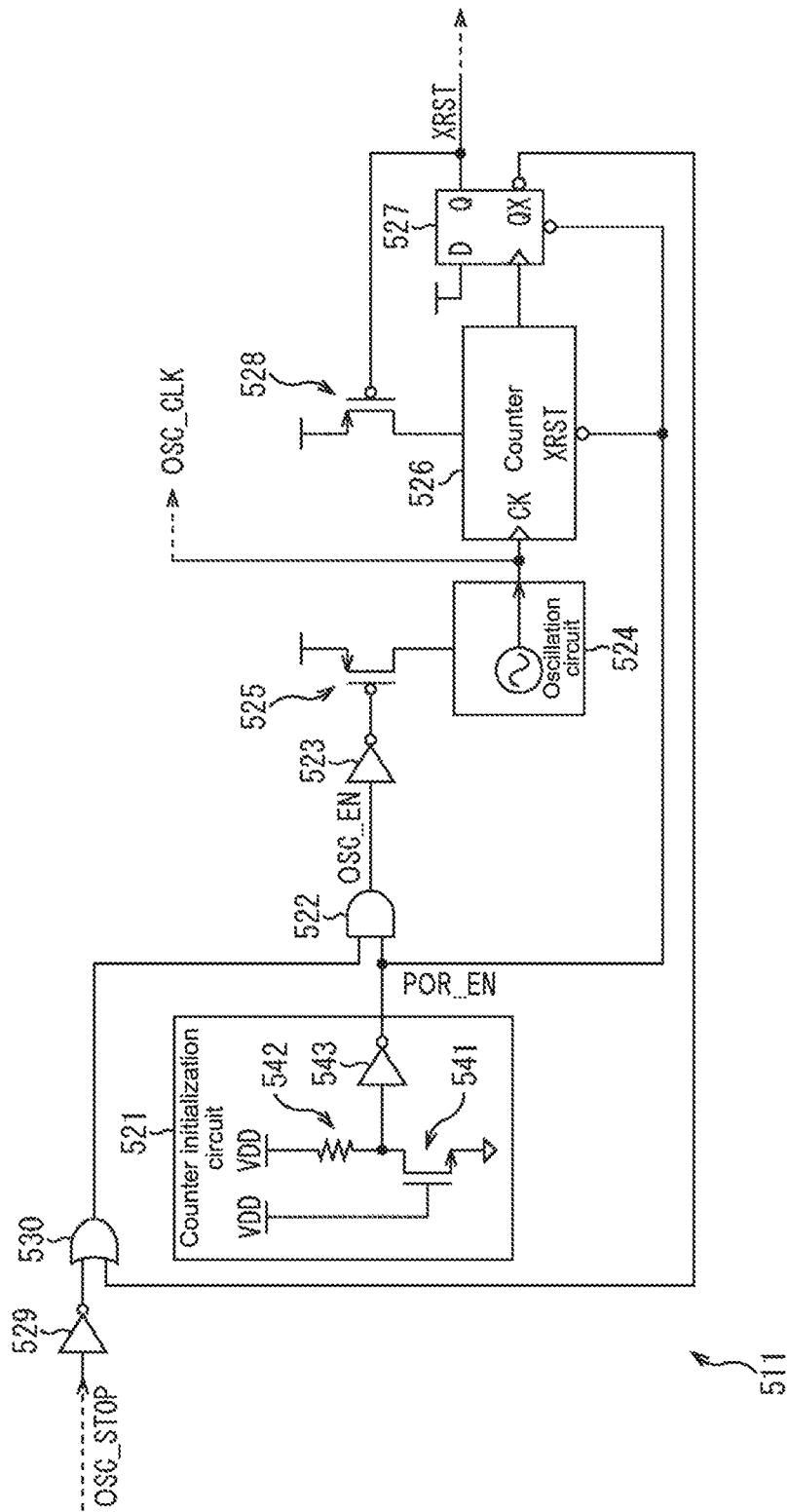
FIG. 12 is a diagram showing a configuration example of a power on reset circuit to which the present technology is applied.

FIG. 12 is a diagram showing a configuration example of one embodiment of a power on reset circuit to which the present technology is applied.

A power on reset circuit 511 shown in FIG. 12 is mounted to a predetermined electronic apparatus and outputs a reset signal XRST to each of blocks within the electronic apparatus. The reset signal XRST is for resetting those blocks.

The power on reset circuit 511 includes a counter initialization circuit 521, an AND gate 522, an inverter 523, an oscillation circuit 524, a power gate switch 525, a counter 526, a flip-flop 527, a power gate switch 528, an inverter 529, and an OR gate 530.

The counter initialization circuit 521 is connected to a predetermined power source provided to the electronic apparatus and outputs a reset signal POR_EN for resetting (initializing) the counter 526 and the flip-flop 527 in accordance with a voltage VDD of the power source to the AND gate 522, the counter 526, and the flip-flop 527.

For example, in a state where the power source of the electronic apparatus is not activated, a reset state of the counter 526 and flip-flop 527 is kept. When the power source is activated, the reset state of the counter 526 and flip-flop 527 is cancelled. Here, it is assumed that in a case where the reset signal POR_EN is at L level (Low level), the counter 526 and the flip-flop 527 are in the reset state.

It should be noted that hereinafter the power source of the voltage VDD described above will also be referred to as a power source VDD.

The counter initialization circuit 521 includes a transistor 541, a resistor 542, and an inverter 543.

The transistor 541 is constituted of an NMOS transistor. A source of the transistor 541 is connected to the ground, and a drain of the transistor 541 is connected to input terminals of the resistor 542 and the inverter 543. Further, a gate of the transistor 541 is connected to the power source VDD.

Further, the power source VDD is connected to one end of the resistor 542, and the transistor 541 and the inverter 543 are connected to the other end of the resistor 542. A terminal on the output side of the inverter 543 is connected to the AND gate 522, the counter 526, and the flip-flop 527.

The AND gate 522 receives input of the reset signal POR_EN from the inverter 543 and input of an output signal from the OR gate 530, and supplies a control signal OSC_EN to the inverter 523. The control signal OSC_EN controls power supply to the oscillation circuit 524, that is, controls an oscillation operation of the oscillation circuit 524, in accordance with those inputs.

The inverter 523 inverts the control signal OSC_EN supplied from the AND gate 522 and supplies the control signal OSC_EN to a gate of the power gate switch 525. The oscillation circuit 524 operates by power supply from the power source connected via the power gate switch 525 and outputs a clock signal OSC_CLK.

The clock signal OSC_CLK is supplied to a block outside the power on reset circuit 511 and to a clock input terminal of the counter 526. Here, the outside block that receives supply of the clock signal OSC_CLK from the oscillation circuit 524 is a block that is provided outside the power on reset circuit 511 and is provided to an electronic apparatus equipped with the power on reset circuit 511, and that performs an operation on the basis of the supplied clock signal OSC_CLK.

The power gate switch 525 is constituted of a PMOS transistor. A source of the power gate switch 525 is connected to the power source, and a drain of the power gate switch 525 is connected to the oscillation circuit 524. Further, the power gate switch 525 is turned on or off on the basis of the signal supplied from the inverter 523 and performs power supply to the oscillation circuit 524. In other words, the power gate switch 525 functions as a power supply control unit that controls power supply to the oscillation circuit 524 to switch the operation status of the oscillation circuit 524.

The counter 526 operates by power supply from a power source connected via the power gate switch 528. In other words, the counter 526 counts a predetermine time, as a delay time (standby time) that elapses before the reset state of the outside block is cancelled, on the basis of the clock signal OSC_CLK supplied from the oscillation circuit 524, and then outputs a count result to the flip-flop 527. It should be noted that the outside block described herein is a block that is reset by the reset signal XRST.

A data input terminal (D terminal) of the flip-flop 527 is connected to a predetermined power source and is configured such that an input is constantly set to H level (High level). The flip-flop 527 functions as a reset signal output unit that generates a reset signal XRST for resetting the outside block and outputs the reset signal XRST.

In other words, the flip-flop 527 generates the reset signal XRST with the count result supplied from the counter 526 being as an input clock, and supplies the reset signal XRST to those outside blocks and a gate of the power gate switch 528. Further, the flip-flop 527 supplies a signal obtained by inverting the reset signal XRST to the OR gate 530.

For example, in a case where the reset signal XRST is at L level, the outside block that receives supply of the reset signal XRST is set to the reset state. That is to say, the reset state is kept. In contrast to this, in a case where the reset signal XRST is at H level, the reset state of the outside block is cancelled.

The power gate switch 528 is constituted of a PMOS transistor. A source of the power gate switch 528 is connected to the power source, and a drain of the power gate switch 528 is connected to the counter 526. Further, the power gate switch 528 is turned on or off on the basis of the reset signal XRST supplied from the flip-flop 527 and performs power supply to the counter 526. In other words, the power gate switch 528 functions as a power supply control unit that controls power supply to the counter 526 to switch the operation status of the counter 526.

The inverter 529 inverts an outside control signal OSC_STOP, which is supplied from the outside, and supplies a resultant signal to the OR gate 530. Here, the outside control signal OSC_STOP is a signal for controlling the oscillation operation of the oscillation circuit 524, that is, a signal for stopping the output of the clock signal OSC_CLK. When the outside control signal OSC_STOP is set to H level, the oscillation operation is stopped.

The OR gate 530 supplies the output signal to the AND gate 522 on the basis of the signal supplied from the flip-flop 527 and the signal supplied from the inverter 529.

<About Operation of Power on Reset Circuit>

Next, description will be given on an operation of the power on reset circuit 511 with reference to FIG. 13.

Figure 13:
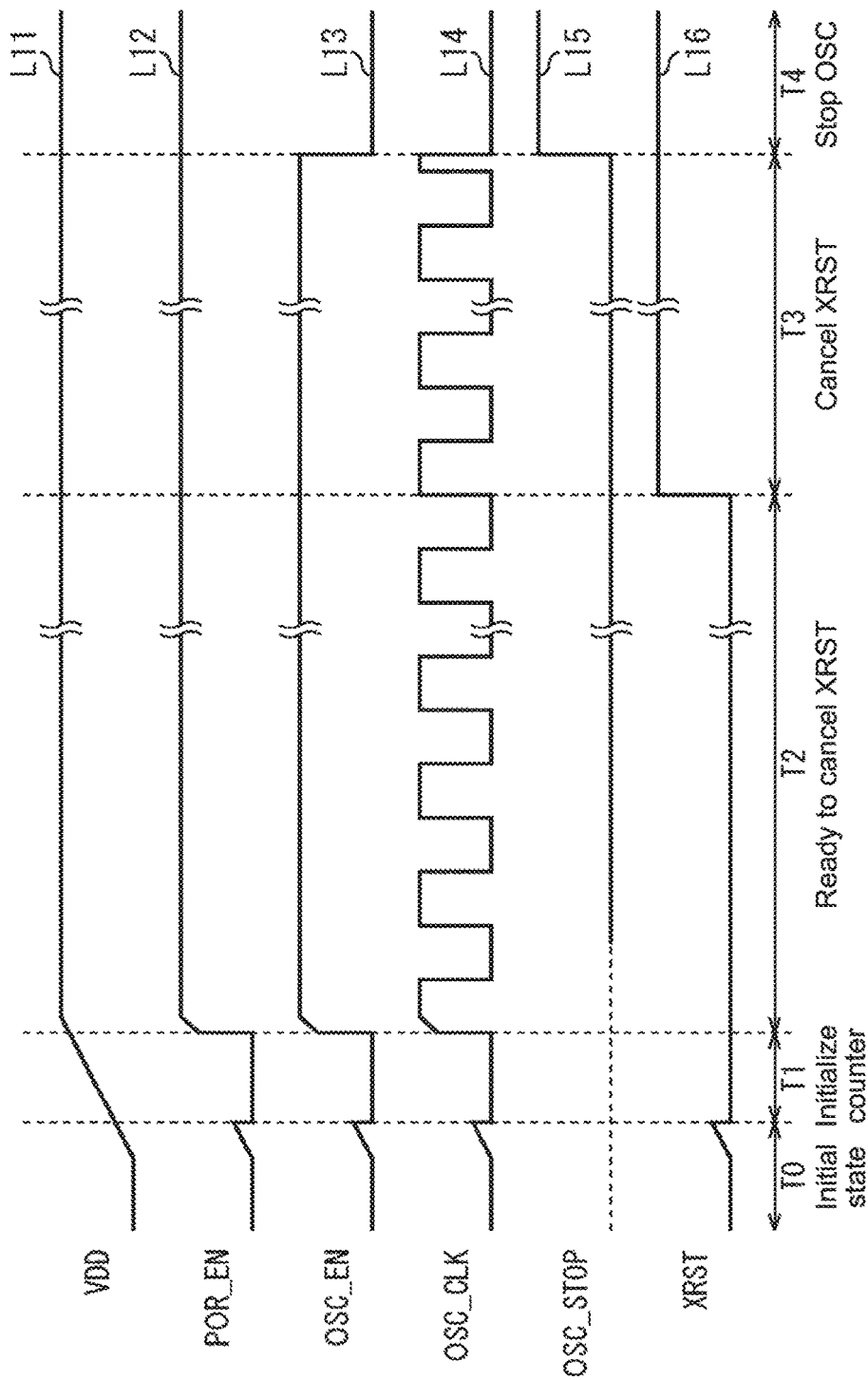
FIG. 13 is a diagram showing operation waveforms of the power on reset circuit.

FIG. 13 shows operation waveforms of the power on reset circuit 511. In other words, in FIG. 13, a broken line L11 to a broken line L16 indicate the voltage VDD, the reset signal POR_EN, the control signal OSC_EN, the clock signal OSC_CLK, the outside control signal OSC_STOP, and the reset signal XRST, respectively. Further, in FIG. 13, the horizontal direction indicates time, and the vertical direction indicates the level of each signal and voltage.

First, in an initial state where the power source VDD of the electronic apparatus is not activated, the reset signal POR_EN is at L level, and a state where the counter 526 and the flip-flop 527 are reset is kept. In such an initial state, when the power source VDD of the electronic apparatus is activated at period T0, the voltage of the power source VDD gradually rises.

In a state where the voltage VDD is lower than a threshold voltage Vth of the transistor 541 within the counter initialization circuit 521, the input of the inverter 543 is pulled up by the resistor 542, and the reset signal POR_EN output from the inverter 543 is at L level. This state is a state in period T1.

At that time, since the reset signal POR_EN is at L level, the counter 526 and the flip-flop 527 that receive supply of the reset signal POR_EN from the inverter 543 keep the reset (initial) state.

Because of this, the reset signal XRST output from the flip-flop 527 is also at L level. Thus, the outside block that receives supply of the reset signal XRST is also kept in the reset state. Further, since the reset signal XRST is at L level, the power gate switch 528 is turned on, and power is supplied to the counter 526. At that time, since the counter 526 keeps the reset state, a signal output from the counter 526 is at L level.

Furthermore, in this state, a signal being at H level, which is the inverted signal of the reset signal XRST, is input to the OR gate 530. Thus, irrespective of the signal level of the outside control signal OSC_STOP, the output signal being at H level is output from the OR gate 530 and supplied to the AND gate 522.

In this case, input to the AND gate 522 are the signal being at H level output from the OR gate 530 and the reset signal POR_EN being at L level output from the inverter 543. Thus, the control signal OSC_EN output from the AND gate 522 is at L level. Because of this, the power gate switch 525 remains in the off state, and power is not supplied to the oscillation circuit 524.

Subsequently, when the voltage VDD of the power source further rises and when the voltage VDD exceeds the threshold voltage Vth of the transistor 541 in period T2, on-resistance of the transistor 541 gradually decreases and an input (input voltage) of the inverter 543 comes close to the ground level.

When the input voltage further decreases and when the input of the inverter 543 exceeds a logical threshold, the reset signal POR_EN output from the inverter 543 changes from L level to H level. Thus, the control signal OSC_EN output from the AND gate 522 also changes from L level to H level. As a result, the signal supplied from the inverter 523 to the gate of the power gate switch 525 becomes L level, and the power gate switch 525 is turned on.

Subsequently, power is supplied from the power source to the oscillation circuit 524 via the power gate switch 525, and the oscillation circuit 524 starts the oscillation operation. In other words, the oscillation circuit 524 performs the oscillation operation to supply the clock signal OSC_CLK to the outside block and the counter 526.

Simultaneously, when the reset signal POR_EN changes from L level to H level, the reset (initialization) of the counter 526 and flip-flop 527 is cancelled. When the clock signal OSC_CLK is supplied from the oscillation circuit 524, the counter 526 starts a count operation based on that clock signal OSC_CLK. The counter 526 then supplies a signal indicating a count result thereof to the clock input terminal of the flip-flop 527.

For example, the counter 526 counts (measures) time from the start of the count operation to the rise of the clock signal OSC_CLK by a predetermined number of times, as a delay time that elapses before the reset state of the outside block is cancelled.

Here, the signal indicating the count result supplied from the counter 526 to the clock input terminal of the flip-flop 527 is a signal being at L level until the count operation by the counter 526 is completed. Because of this, the reset signal XRST output from the flip-flop 527 remains at L level.

When a predetermined delay time has elapsed from the start of the count operation and the count operation by the counter 526 is completed, in period T3, the counter 526 supplies the signal being at H level, as the signal indicating the count result, to the flip-flop 527. In other words, when the count operation is completed, the signal indicating the count result, which is output from the counter 526, changes from L level to H level.

Thus, the reset signal XRST output from the flip-flop 527 also changes from L level to H level, the reset of outside blocks that receive supply of the reset signal XRST is cancelled, and those blocks start the operation. Subsequently, the reset signal XRST then remains at H level.

In such a manner, by generation of the reset signal XRST by using the counter 526 and the flip-flop 527, the outside blocks can be reliably reset. In other words, time that elapses before the reset signal XRST is inverted is delayed by a predetermined time by the count operation of the counter 526, so that the reset signal XRST having a sufficient pulse width can be obtained and the outside blocks can be reliably reset.

Further, when the count operation is completed and the reset signal XRST is set to H level, the power gate switch 528 is turned off, and the counter 526 is disconnected from the power source. In other words, power supply to the counter 526 is stopped, and the counter 526 thus stops the operation.

In such a manner, after the reset by the reset signal XRST is cancelled, the power gate switch 528 is turned off to stop power supply to the counter 526, so that the leakage current of the counter 526 can be significantly reduced, and the current consumption of the power on reset circuit 511 can be cut down.

Further, after the reset by the reset signal XRST is cancelled, in a case where the clock signal OSC_CLK output from the oscillation circuit 524 becomes unnecessary as a system, a signal being at H level is supplied as an outside control signal OSC_STOP supplied from the outside. That is to say, the outside control signal OSC_STOP is set to H level that indicates the stop of the oscillation operation.

In such a case, supplied to the OR gate 530 are a signal being at L level obtained by inverting the reset signal XRST being at H level, which is output from the flip-flop 527, and a signal being at L level obtained by inverting the outside control signal OSC_STOP being at H level, which is output from the inverter 529.

Therefore, since the signals being at L level are supplied from the OR gate 530 to the AND gate 522, the control signal OSC_EN output from the AND gate 522 is inverted to L level. Thus, a signal being at H level obtained by inverting the control signal OSC_EN is supplied from the inverter 523 to the gate of the power gate switch 525, the power gate switch 525 is turned off, and the oscillation circuit 524 is disconnected from the power source. In other words, power supply to the oscillation circuit 524 is stopped, and the oscillation operation by the oscillation circuit 524 is stopped.

Such a state is a state of period T4. In such a manner, the power supply to the oscillation circuit 524 is stopped. Thus, similarly to the case of the counter 526, the leakage current of the oscillation circuit 524 can be significantly reduced, and the current consumption of the power on reset circuit 511 can be cut down.

It should be noted that in this embodiment the clock signal OSC_CLK output from the oscillation circuit 524 is supplied to not only the counter 526 but also a block outside the power on reset circuit 511. Therefore, while the outside block is operating, the supply of the clock signal OSC_CLK from the oscillation circuit 524 to the outside block becomes necessary. In such a case, the outside control signal OSC_STOP only needs to be set to L level until the supply of the clock signal OSC_CLK becomes unnecessary.

In such a manner, the power gate switch 525 stops power supply to the oscillation circuit 524 as appropriate in accordance with each signal status (level) of the reset signal XRST, the outside control signal OSC_STOP, and the reset signal POR_EN, and thus stops the operation of the oscillation circuit 524.

As described above, the power on reset circuit 511 generates the reset signal XRST on the basis of the count operation by the counter 526, and when the reset by the reset signal XRST is cancelled, turns off the power gate switch 528 and stops power supply to the counter 526. Further, when the reset by the reset signal XRST is cancelled, the power on reset circuit 511 turns off the power gate switch 525 in accordance with the outside control signal OSC_STOP and stops power supply to the oscillation circuit 524.

In such a manner, after the reset of the outside block by the reset signal XRST is cancelled, power supply to the counter 526 or the oscillation circuit 524 is stopped, so that the leakage current can be significantly reduced, and the current consumption can thus be cut down.

After the reset by the reset signal XRST is cancelled, the power on reset circuit 511 itself is unnecessary, that is, the power on reset circuit 511 does not operate thereafter. Because of this, ideally, after the reset is cancelled, the leakage current of the power on reset circuit 511 is desirably set to zero.

In this regard, in the power on reset circuit 511 to which the present technology is applied, the power gate switch 525 and the power gate switch 528 are provided, so that power supply to the oscillation circuit 524 and the counter 526 can be controlled. This enables the leakage current to be cut down to the extreme while sufficiently ensuring the pulse width of the reset signal XRST by using delay by the count operation in a simple and small configuration in which the power gate switches are provided.

In particular, in the power on reset circuit 511, the leakage current of the counter 526 can be significantly reduced. Further, in the power on reset circuit 511, providing the power gate switch can reduce the leakage current, and thus the circuit size of the power on reset circuit 511 is not increased.

Furthermore, in the power on reset circuit 511, with the outside control signal OSC_STOP supplied from the outside, the oscillation circuit 524 can be kept operating or the oscillation operation can be stopped as needed.

Such control of the oscillation circuit 524 can stop the oscillation operation when the clock signal OSC_CLK is unnecessary in the outside block, and can significantly cut down unnecessary current consumption. For example, in an application for a sensor network, a mobile wearable device, or the like, there is a need for cutting down the current consumption of the semiconductor chip to the extreme, and a technique of cutting down the current consumption according to the present technology becomes an effective solving method.

Eighth Embodiment

Configuration Example of Power on Reset Circuit

It should be noted that it is assumed in the seventh embodiment that the clock signal OSC_CLK is used also in a block outside the power on reset circuit 511.

Because of this, in the power on reset circuit 511 shown in FIG. 12, the outside control signal OSC_STOP is set depending on the necessity of the clock signal OSC_CLK in an outside block and the oscillation operation of the oscillation circuit 524 can be stopped.

In contrast to this, in a case where the clock signal OSC_CLK is used only within the power on reset circuit 511 and is not used in an outside block, the oscillation operation of the oscillation circuit 524 may be stopped after the reset by the reset signal XRST is cancelled.

Figure 14:
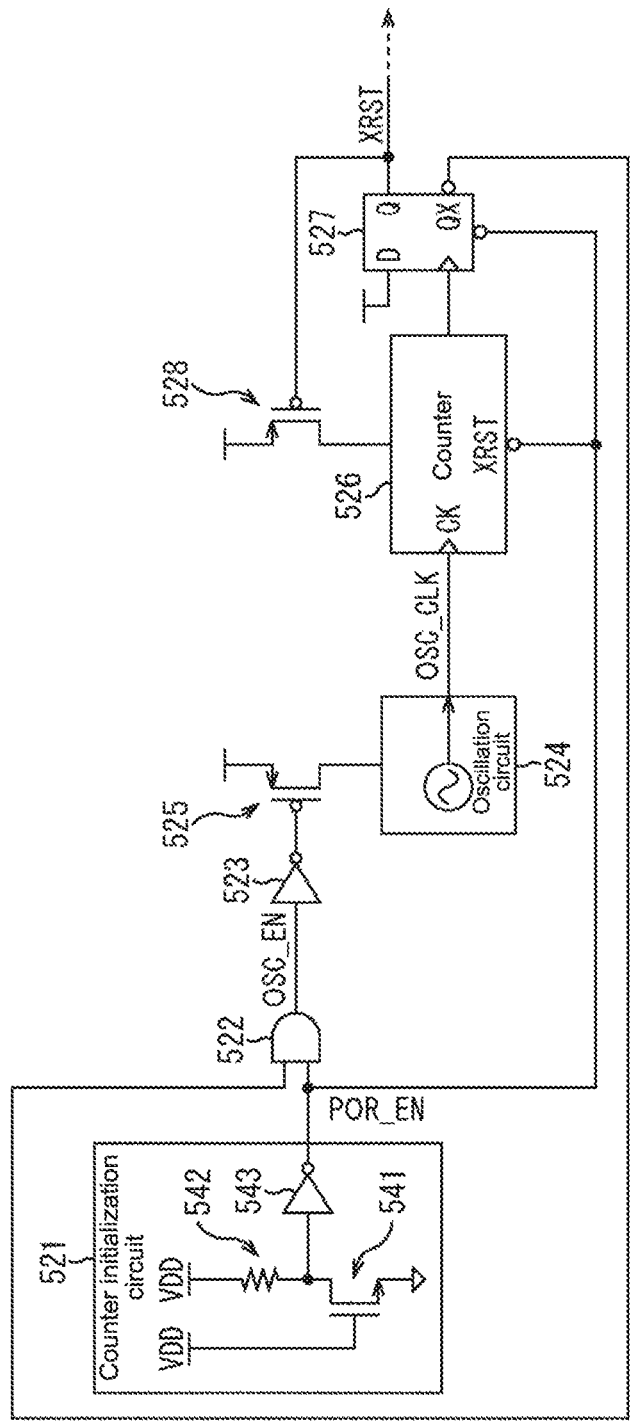
FIG. 14 is a diagram showing another configuration example of the power on reset circuit.

In such a case, the power on reset circuit 511 is configured as shown in, for example, FIG. 14. It should be noted that, in FIG. 14, parts corresponding to the case of FIG. 12 are denoted by the same reference symbols and description thereof will be omitted as appropriate.

A configuration of the power on reset circuit 511 shown in FIG. 14 is different from the configuration of the power on reset circuit 511 of FIG. 12 in that the inverter 529 and the OR gate 530 are not provided, and is the same as the configuration of the power on reset circuit 511 of FIG. 12 in other points.

In the power on reset circuit 511 of FIG. 14, the outside control signal OSC_STOP is not supplied from the outside. Further, the signal obtained by inverting the reset signal XRST, which is output from the flip-flop 527, is input to the AND gate 522.

Therefore, immediately after the power source VDD of the electronic apparatus is activated, the reset signal XRST is at L level. Thus, a signal being at H level, which is obtained by inverting the reset signal XRST, is supplied from the flip-flop 527 to the AND gate 522. Further, immediately after the power source VDD is activated, as described above, the reset signal POR_EN being at L level is supplied to the AND gate 522.

In such a state, since the control signal OSC_EN supplied from the AND gate 522 becomes L level, the power gate switch 525 remains off. Subsequently, when the voltage VDD of the power source rises and the reset signal POR_EN is inverted to H level, the control signal OSC_EN is also inverted to H level, and the power gate switch 525 is turned on. Thus, the oscillation operation by the oscillation circuit 524 is started.

Meanwhile, after the oscillation operation is started, when the count operation by the counter 526 is completed and the reset signal XRST becomes H level, and when the reset of the outside block is cancelled, a signal being at L level is supplied from the flip-flop 527 to the AND gate 522.

The control signal OSC_EN is then inverted from H level to L level, and the power gate switch 525 is turned off. Thus, power supply to the oscillation circuit 524 is stopped, and the oscillation operation is also stopped.

In such a manner, in a case where the clock signal OSC_CLK is used only within the power on reset circuit 511, immediately after the reset by the reset signal XRST is cancelled, the power gate switch 525 is turned off, and power supply to the oscillation circuit 524 is stopped, so that the leakage current of the oscillation circuit 524 can be reduced.

Ninth Embodiment

Configuration Example of Power on Reset Circuit

Furthermore, the above has described that, in the power on reset circuit 511 described above, the power gate switch 525 and the power gate switch 528 are each constituted of a PMOS transistor, but a power gate switch that controls power supply to the oscillation circuit 524 and the counter 526 may be constituted of an NMOS transistor.

Figure 15:
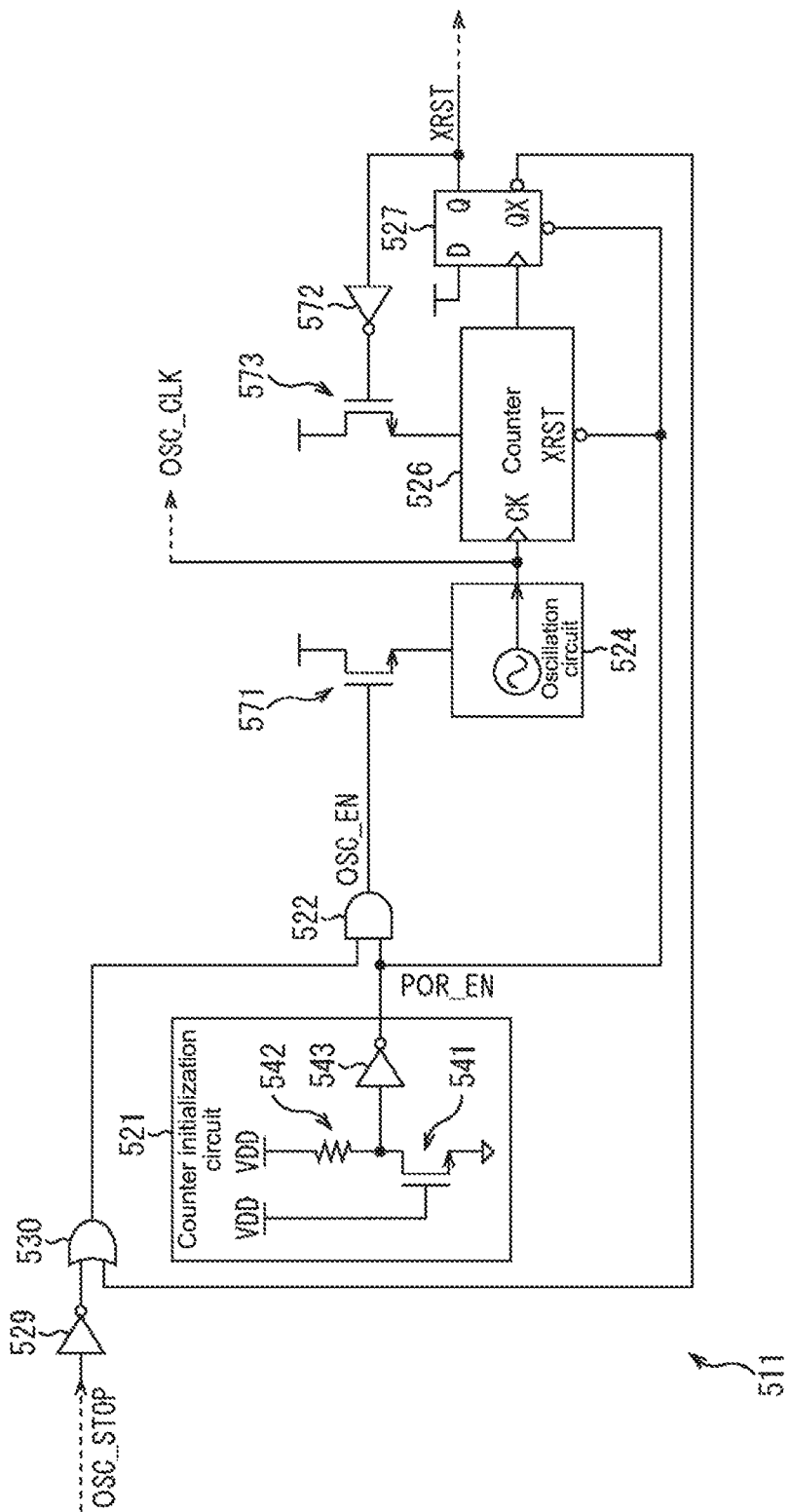
FIG. 15 is a diagram showing another configuration example of the power on reset circuit.

In such a case, the power on reset circuit 511 is configured as shown in, for example, FIG. 15. It should be noted that, in FIG. 15, parts corresponding to the case of FIG. 12 are denoted by the same reference symbols and description thereof will be omitted as appropriate.

A configuration of the power on reset circuit 511 shown in FIG. 15 is different from the configuration of the power on reset circuit 511 of FIG. 12 in that a power gate switch 571 is provided instead of the inverter 523 and the power gate switch 525, and an inverter 572 and a power gate switch 573 are provided instead of the power gate switch 528.

In the power on reset circuit 511 shown in FIG. 15, the power gate switch 571 controls power supply to the oscillation circuit 524.

The power gate switch 571 is constituted of an NMOS transistor. A drain of the power gate switch 571 is connected to a power source, and a source of the power gate switch 571 is connected to the oscillation circuit 524. Further, the power gate switch 571 is turned on or off on the basis of the control signal OSC_EN supplied from the AND gate 522 to a gate of the power gate switch 571, to perform power supply to the oscillation circuit 524.

Specifically, in a case where the control signal OSC_EN is at H level, the power gate switch 571 is turned on and supplies power from the power source to the oscillation circuit 524. In contrast to this, in a case where the control signal OSC_EN is at L level, the power gate switch 571 is turned off and stops power supply to the oscillation circuit 524.

Further, in the power on reset circuit 511 of FIG. 15, the reset signal XRST output from the flip-flop 527 is also supplied to the inverter 572. The inverter 572 inverts the reset signal XRST supplied from the flip-flop 527 and supplies a resultant signal to a gate of the power gate switch 573.

The power gate switch 573 is constituted of an NMOS transistor. A drain of the power gate switch 573 is connected to a power source, and a source of the power gate switch 573 is connected to the counter 526. Further, the power gate switch 573 is turned on or off on the basis of a signal obtained by inverting the reset signal XRST, which is supplied from the inverter 572, to perform power supply to the counter 526.

Specifically, in a case where the reset signal XRST is at L level, the power gate switch 573 is turned on and supplies power from the power source to the counter 526. In contrast to this, in a case where the reset signal XRST is at H level, the power gate switch 573 is turned off and stops power supply to the counter 526.

In such a manner, the power on reset circuit 511 shown in FIG. 15 is different from the power on reset circuit 511 shown in FIG. 12 only in that the power gate switch is constituted of a PMOS transistor or an NMOS transistor.

The power gate switch that switches between on and of the power supply to the oscillation circuit 524 and the counter 526 needs characteristics of a small leakage current when the power gate switch is turned off and a small on-resistance. Therefore, it is desirable to take into consideration those two characteristics to select a PMOS transistor or an NMOS transistor for the power gate switch.

The same holds true for the size of the MOS transistor, that is, an L length (gate length) and a W length (gate width), and a threshold voltage of the MOS transistor.

In other words, in order to make the leakage current smaller, a MOS transistor having a long L length and a short W length may be used for designing, but in order to make the on-resistance smaller, a MOS transistor having a short L length and a short W length may be used for designing. In such a manner, for the size of the MOS transistor as well, an optimal size may be selected in consideration of the two characteristics described above.

Further, for the threshold voltage of the MOS transistor as well, a MOS transistor having a high threshold voltage may be used in order to make the leakage current smaller, but a MOS transistor having a low threshold voltage may be used in order to make the on-resistance smaller. Therefore, for the threshold voltage of the MOS transistor as well, a MOS transistor of an optimal threshold voltage may be selected in consideration of the two characteristics described above.

Another Configuration Example of Counter Initialization Circuit

Further, the counter initialization circuit 521 described above is not limited to the configuration shown in FIG. 12 and may have any other configuration as long as the counter initialization circuit 521 outputs a reset signal POR_EN that resets the counter 526 and the flip-flop 527 in accordance with the voltage VDD of the power source.

Figure 16:
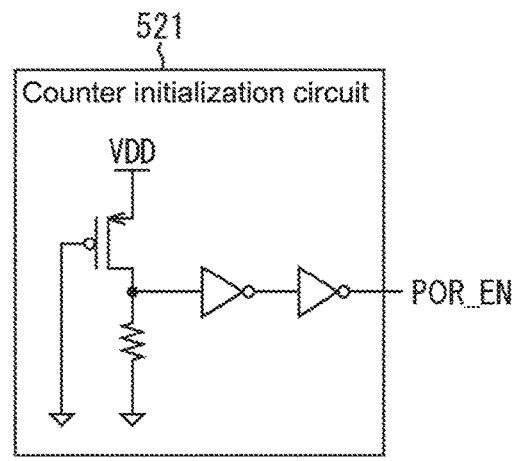
FIG. 16 is a diagram showing another configuration example of a counter initialization circuit.
Figure 17:
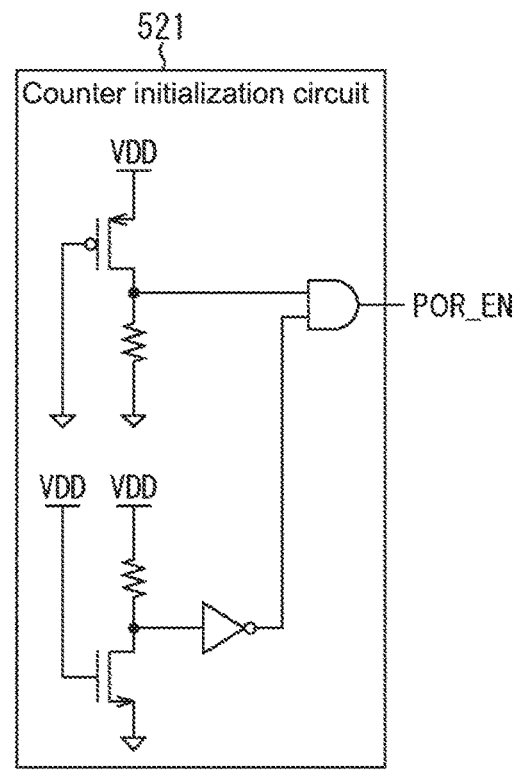
FIG. 17 is a diagram showing another configuration example of the counter initialization circuit.
Figure 18:
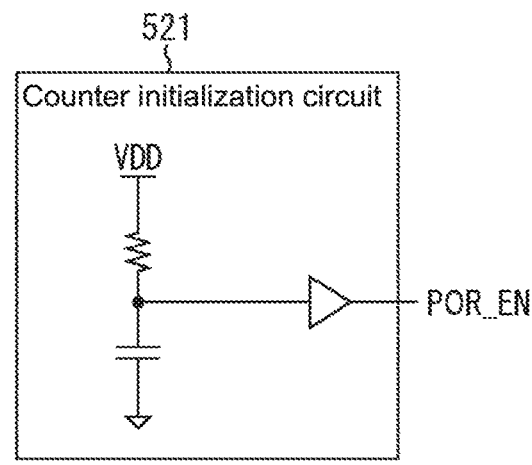
FIG. 18 is a diagram showing another configuration example of the counter initialization circuit.

For example, the counter initialization circuit 521 can have configurations respectively shown in FIGS. 16 to 18.

A counter initialization circuit 521 shown in FIG. 16 is constituted of a PMOS transistor, a resistor, and two inverters. In other words, a power source of a voltage VDD is connected to a source of the PMOS transistor, the ground is connected to a drain of the PMOS transistor via the resistor, and the two inverters connected in series are also connected to the drain of the PMOS transistor.

In this example, in a state where the voltage VDD is low, the input of the inverter is pulled down by the resistor, and the reset signal POR_EN output from the inverter is at L level. Subsequently, when the voltage VDD rises, and when a gate-source voltage increases and exceeds a threshold voltage, a current flows in the PMOS transistor and an input voltage of the inverter increases, and the reset signal POR_EN is inverted to H level.

The counter initialization circuit 521 shown in FIG. 12 has a circuit configuration in which the voltage at which the reset signal POR_EN changes from L level to H level significantly depends on the threshold voltage of the transistor 541 that is an NMOS transistor. In contrast to this, the counter initialization circuit 521 shown in FIG. 16 has a circuit configuration in which a voltage at which the reset signal POR_EN changes from L level to H level significantly depends on the threshold voltage of the PMOS transistor.

Further, a counter initialization circuit 521 shown in FIG. 17 is constituted of a circuit including the transistor 541, the resistor 542, and the inverter 543 shown in FIG. 12, a circuit including the PMOS transistor and the resistor shown in FIG. 16, and an AND gate that inputs the outputs of those two circuits and outputs the reset signal POR_EN.

This example provides a circuit configuration in which a voltage at which the reset signal POR_EN changes from L level to H level depends on both the threshold voltage of the transistor 541 as an NMOS transistor and the threshold voltage of the PMOS transistor. Because of this, a stable operation can be achieved irrespective of manufacturing variations of those transistors.

Furthermore, a counter initialization circuit 521 shown in FIG. 18 is constituted of a resistor, a capacitor, and a buffer. In other words, a power source VDD is connected to the resistor at one end, and the ground is connected to the resistor at the other end via the capacitor. The buffer is also connected to the resistor at the other end.

In this example, the reset signal POR_EN is generated by a time constant of the resistor and the capacitor. In other words, when the voltage VDD of the power source rises and the capacitor is charged, the input voltage of the buffer rises. Thus, the reset signal POR_EN changes from L level to H level.

Configuration Example of Oscillation Circuit

Further, the oscillation circuit 524 that constitutes the power on reset circuit 511 may have any configuration as long as the oscillation circuit 524 can output a clock signal OSC_CLK for performing a count operation in the counter 526. For example, the oscillation circuit 524 can have configurations respectively shown in FIGS. 19 and 20.

Figure 19:
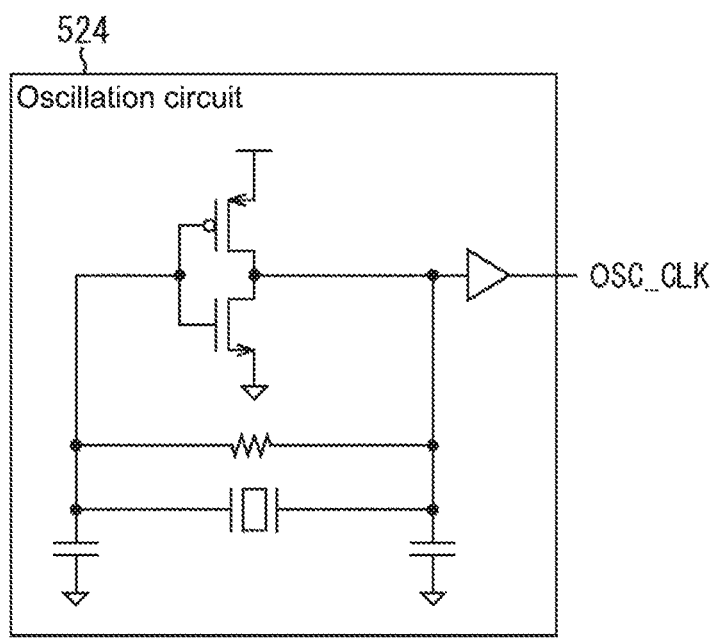
FIG. 19 is a diagram showing a configuration example of an oscillation circuit.

An oscillation circuit 524 shown in FIG. 19 has a configuration including a crystal oscillator, a load capacitor, and a Pierce oscillator circuit, and is configured to output an oscillation clock, as a clock signal OSC_CLK, from a buffer connected to the Pierce oscillator circuit.

In this example, when a voltage is applied to the crystal oscillator, the crystal oscillator oscillates, and a voltage signal corresponding to the oscillation is output. The amplitude of the voltage signal is then amplified by the Pierce oscillator circuit and is output as the clock signal OSC_CLK.

Figure 20:
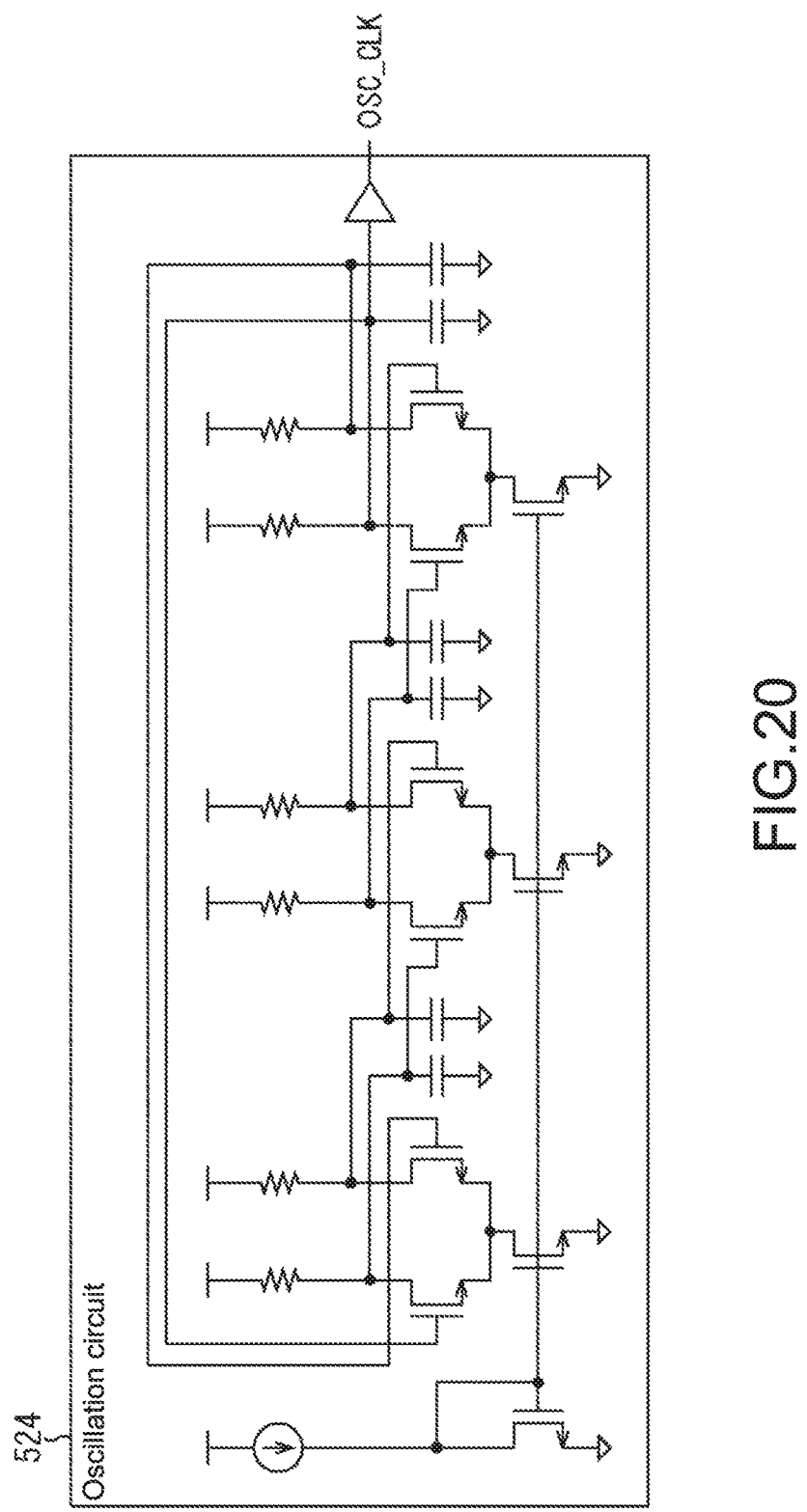
FIG. 20 is a diagram showing a configuration example of the oscillation circuit.

Furthermore, an oscillation circuit 524 shown in FIG. 20 is a three-stage ring oscillation circuit constituted of delay stages in which the amount of delay is determined from the size of the resistor and that of the capacitor. A clock signal OSC_CLK is output from a buffer at the last stage of the ring oscillation circuit.

Configuration Example of Counter

Furthermore, the counter 526 that constitutes the power on reset circuit 511 may have any configuration as long as the counter 526 can perform a count operation on the basis of an input clock signal OSC_CLK and measure a predetermined delay time. For example, the counter 526 can have configurations respectively shown in FIGS. 21 and 22.

Figure 21:
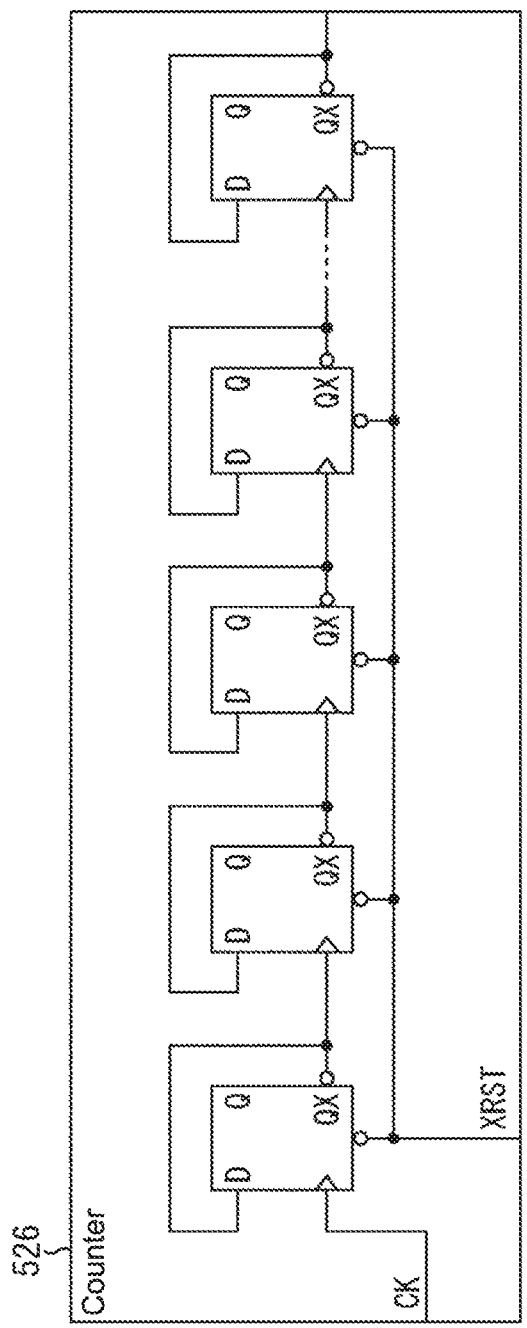
FIG. 21 is a diagram showing a configuration example of a counter.

A counter 526 shown in FIG. 21 is a counter circuit having a configuration in which one-half divider circuits constituted of flip-flops are cascade connected.

In this example, a terminal (QX terminal) that inverts and outputs an output of a flip-flop at a front stage is connected to a clock input of a flip-flop, and the QX terminal of the flip-flop itself is connected to an input terminal (D terminal) of that flip-flop, to constitute the one-half divider circuit.

When such one-half divider circuits are cascade connected, a clock signal OSC_CLK that is input to a clock input terminal of a flip-flop at an initial stage is divided by two in each of the one-half divider circuits, and is output as a count result to the flip-flop 527. Because of this, when a predetermined number of clocks is counted, a signal indicating a count result to be output changes from L level to H level. In this case, time (delay time) that elapses before a count value, that is, the signal indicating the count result is inverted can be adjusted by the number of one-half divider circuits.

Figure 22:
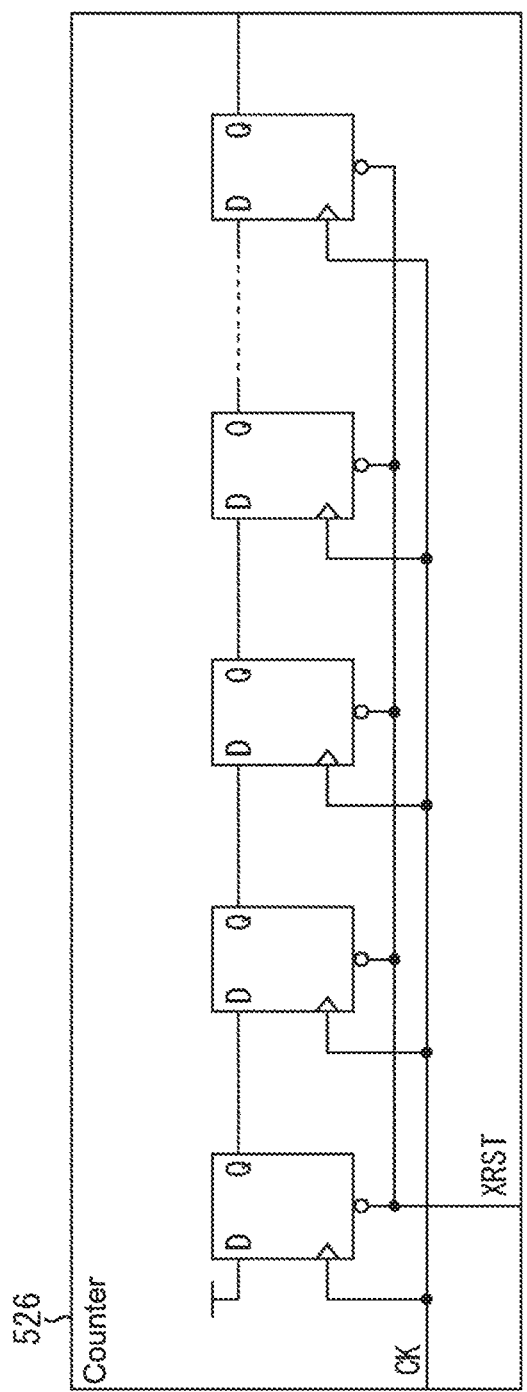
FIG. 22 is a diagram showing a configuration example of the counter.

Further, a counter 526 shown in FIG. 22 is a counter circuit having a configuration in which multiple flip-flops are connected similarly to the shift register.

In this example, a signal value at H level, which is taken in the first flip-flop, is sequentially taken in flip-flops at the rear stages at a timing of rise of the clock signal OSC_CLK supplied to a clock input terminal of the flip-flop. Therefore, when a predetermined number of clocks is counted, a signal indicating a count result, which is output from a flip-flop at the last stage, changes from L level to H level. In this example, time (delay time) that elapses before a count value, that is, the signal indicating the count result is inverted can be adjusted by the number of flip-flops.

As described above, it is possible to reduce a leakage current while sufficiently ensuring a pulse width of a reset signal by providing power gate switches between a power source and a circuit such as the oscillation circuit 524 and the counter 526, in which a leakage current occurs, and turning off those power gate switches as needed after reset of an outside block is cancelled.

It should be noted that the embodiments of the present technology are not limited to the embodiments described above and can be variously modified without departing from the gist of the present technology.

Furthermore, the present technology can have the following configurations.

[1] A power source monitoring circuit, which controls an operation of a level shifter on the basis of a status of a first power source that supplies power to a first block and an operation status control signal for controlling an operation status of a second block that receives power supply from a second power source and receives supply of a signal, the second power source being different from the first power source, the signal being output from the first block and level-converted by the level shifter,
the power source monitoring circuit including
a current control unit that is provided on a path of a steady-state current and sets a state where the steady-state current is inhibited from flowing in accordance with the operation status control signal.

[2] The power source monitoring circuit according to [1], in which
in a case where the operation status control signal is a signal indicating that the operation status of the second block is set to a standby state, the operation of the level shifter is stopped.

[3] The power source monitoring circuit according to [1] or [2], in which
the current control unit is a transistor that is turned off in a case where the operation status control signal is a signal indicating that the operation status of the second block is set to a standby state.

[4] The power source monitoring circuit according to any one of [1] to [3], in which
in a case where the first power source is not activated, the second block is set to a standby state.

[5] A semiconductor device, including:
a first block that operates by power supply from a predetermined power source;
a level shifter that performs level conversion on a signal that is output from the first block;
a second block that operates by power supply from another power source different from the power source and receives supply of a signal that is obtained by the level conversion; and
a power source monitoring circuit that controls an operation of the level shifter on the basis of a status of the power source and an operation status control signal for controlling an operation status of the second block, the power source monitoring circuit including a current control unit that is provided on a path of a steady-state current and sets a state where the steady-state current is inhibited from flowing in accordance with the operation status control signal.

[6] The semiconductor device according to [5], in which
in a case where the operation status control signal is a signal indicating that the operation status of the second block is set to a standby state, the power source monitoring circuit stops the operation of the level shifter.

[7] The semiconductor device according to [5] or [6], in which
the current control unit is a transistor that is turned off in a case where the operation status control signal is a signal indicating that the operation status of the second block is set to a standby state.

[8] The semiconductor device according to any one of [5] to [7], in which
in a case where the power source is not activated, the power source monitoring circuit sets the second block to a standby state.

[9] The semiconductor device according to any one of [5] to [8], in which
the semiconductor device includes the multiple level shifters, and
the power source monitoring circuit supplies the same control signal to each of the multiple level shifters and controls an operation of each of the multiple level shifters.

[10] The semiconductor device according to any one of [5] to [9], in which
the semiconductor device includes
the multiple second blocks, and
the one or more level shifters and the power source monitoring circuit for each of the second blocks.

[11] The semiconductor device according to [10], in which
the multiple second blocks operate by power supply from other power sources having mutually different power source voltages.

[12] The semiconductor device according to [10], in which
the multiple second blocks operate by power supply from the other same power source.

[13] The semiconductor device according to any one of [5] to [12], further including
a first power gate switch that is provided between the power source and the first block.

[14] The semiconductor device according to any one of [5] to [13], further including
a second power gate switch that is provided between the other power source and the second block and is turned on or off in accordance with control of the power source monitoring circuit.

[15] A power on reset circuit, including:
a counter that performs a count operation on the basis of an input clock signal;
a reset signal output unit that outputs a reset signal for resetting an outside block, on the basis of a count result by the counter; and
a first power gate switch that controls power supply to the counter in accordance with the reset signal.

[16] The power on reset circuit according to [15], further including:
an oscillation unit that outputs the clock signal; and
a second power gate switch that controls power supply to the oscillation unit in accordance with the reset signal.

[17] The power on reset circuit according to [16], in which in a case where reset of the outside block by the reset signal is cancelled, the second power gate switch stops the power supply to the oscillation unit.

[18] The power on reset circuit according to [16], in which the second power gate switch controls the power supply to the oscillation unit in accordance with an outside control signal for controlling an oscillation operation of the oscillation unit and the reset signal.

[19] The power on reset circuit according to [18], in which in a case where the outside control signal is a signal indicating stop of the oscillation operation and in a case where reset of the outside block by the reset signal is cancelled, the second power gate switch stops the power supply to the oscillation unit.

[20] The power on reset circuit according to any one of [15] to [19], further including
an initialization unit that resets the counter and the reset signal output unit and, in a case where a power source is activated, cancels reset of the counter and the reset signal output unit.

[21] A semiconductor device, including
a power on reset circuit including
a counter that performs a count operation on the basis of an input clock signal,
a reset signal output unit that outputs a reset signal for resetting an outside block, on the basis of a count result by the counter, and
a power gate switch that controls power supply to the counter in accordance with the reset signal.

REFERENCE SIGNS LIST 11 semiconductor device
21 block
22 level shifter circuit
23 block
24 power source monitoring circuit
72 transistor
111-1 to 111-5, 111 level shifter circuit
151-1 to 151-5, 151 level shifter circuit
152 block
153 power source monitoring circuit
154-1 to 154-5, 154 level shifter circuit
155 block
156 power source monitoring circuit
511 power on reset circuit
521 counter initialization circuit
524 oscillation circuit
525 power gate switch
526 counter
527 flip-flop
528 power gate switch

The invention claimed is:
1. A power source monitoring circuit, configured to:
control an operation of a level shifter based on a status of a first power source configured to supply power to a first block and an operation status control signal configured to control an operation status of a second block,
wherein the second block is configured to:
receive a power supply from a second power source; and
receive a first signal from the level shifter,
wherein the second power source is different from the first power source, and
wherein the level shifter is configured to:
receive a second signal output from the first block; and
output the first signal based on level conversion of the second signal,
the power source monitoring circuit comprising:
a current control unit on a path of a steady-state current,
wherein the current control unit is configured to set a state where the steady-state current is inhibited from flowing in the power source monitoring circuit based on the operation status control signal.

2. The power source monitoring circuit according to claim 1, wherein based on the operation status control signal indicating that the operation status of the second block is set to a standby state, the power source monitoring circuit is further configured to stop the operation of the level shifter.

3. The power source monitoring circuit according to claim 1, wherein the current control unit is a transistor configured to turn off based on the operation status control signal indicating that the operation status of the second block is set to a standby state.

4. The power source monitoring circuit according to claim 1, wherein based on the first power source not being activated, the power source monitoring circuit is further configured to set the second block to a standby state.

5. A semiconductor device, comprising:
a first block configured to operate based on a first power supply from a first power source;
a level shifter configured to level convert a first signal output from the first block;
a second block configured to:
operate based on a second power supply from a second power source different from the first power source; and
receive a second signal obtained by the level conversion of the first signal by the level shifter; and
a power source monitoring circuit configured to control an operation of the level shifter based on a status of the first power source and an operation status control signal configured to control an operation status of the second block,
the power source monitoring circuit including
a current control unit on a path of a steady-state current,
wherein the current control unit is configured to set a state where the steady-state current is inhibited from flowing in the power source monitoring circuit based on the operation status control signal.

6. The semiconductor device according to claim 5, wherein based on the operation status control signal indicating that the operation status of the second block is set to a standby state, the power source monitoring circuit is further configured to stop the operation of the level shifter.

7. The semiconductor device according to claim 5, wherein the current control unit is a transistor configured to turn off based on the operation status control signal indicating that the operation status of the second block is set to a standby state.

8. The semiconductor device according to claim 5, wherein based on the first power source not being activated, the power source monitoring circuit is further configured to set the second block to a standby state.

9. The semiconductor device according to claim 5, further comprising a plurality of level shifters, and
wherein the power source monitoring circuit is further configured to:
supply a same control signal to each level shifter of the plurality of level shifters; and
control an operation of each level shifter of the plurality of level shifters.

10. The semiconductor device according to claim 5, further comprising a plurality of second blocks,
wherein each second block of the plurality of second blocks is associated with one or more level shifters and one or more power source monitoring circuits.

11. The semiconductor device according to claim 10, wherein each second block of the plurality of second blocks is configured to operate based on a third power supply from different power sources having mutually different power source voltages.

12. The semiconductor device according to claim 10, wherein each second block of the plurality of second blocks is configured to operate based on a fourth power supply from a same power source.

13. The semiconductor device according to claim 5, further comprising a first power gate switch between the first power source and the first block.

14. The semiconductor device according to claim 5, further comprising a second power gate switch between the second power source and the second block,
wherein the power source monitoring circuit is further configured to turn on or off the second power gate switch.

* * * * *